US012772455B2

(12) United States Patent
Sun et al.

(10) Patent No.: US 12,772,455 B2
(45) Date of Patent: Oct. 20, 2026

(54) FERROELECTRIC MEMORY DEVICE AND METHOD FOR FORMING THE SAME

(71) Applicant: Wuxi Smart Memories Technologies Co., Ltd., Wuxi (CN)

(72) Inventors: Jianhua Sun, Wuxi (CN); Yushi Hu, Wuxi (CN); Meilan Guo, Wuxi (CN); Zhenyu Lu, Wuxi (CN); Wei Zhang, Wuxi (CN)

(73) Assignee: WUXI SMART MEMORIES TECHNOLOGIES CO., LTD., Wuxi (CN)

( * ) Notice: Subject to any disclaimer, the term of this patent is extended or adjusted under 35 U.S.C. 154(b) by 408 days.

(21) Appl. No.: 18/238,044

(22) Filed: Aug. 25, 2023

(65) Prior Publication Data

US 2023/0413576 A1 Dec. 21, 2023

Related U.S. Application Data

(63) Continuation of application No. PCT/CN2021/088675, filed on Apr. 21, 2021.

(51) Int. Cl.
*H10B 53/30* (2023.01)
*G11C 11/22* (2006.01)

(52) U.S. Cl.
CPC ............ *H10B 53/30* (2023.02); *G11C 11/221* (2013.01)

(58) Field of Classification Search
CPC ........ H10B 53/30; H10B 53/20; G11C 11/221
See application file for complete search history.

(56) References Cited

U.S. PATENT DOCUMENTS

| | | | | |
|---|---|---|---|---|
| 2004/0042134 A1* | 3/2004 | Kim | H10B 53/00 | 257/E21.664 |
| 2004/0051176 A1 | 3/2004 | Jan et al. | | |
| 2004/0065913 A1* | 4/2004 | Shimada | H10B 53/00 | 257/296 |
| 2004/0164323 A1* | 8/2004 | Joo | H10B 53/00 | 257/E21.664 |
| 2006/0027847 A1* | 2/2006 | Koo | H10B 53/00 | 257/532 |
| 2006/0118841 A1* | 6/2006 | Eliason | H10B 53/00 | 257/295 |

(Continued)

FOREIGN PATENT DOCUMENTS

| | | |
|---|---|---|
| CN | 1694256 A | 11/2005 |
| CN | 1738052 A | 2/2006 |

(Continued)

OTHER PUBLICATIONS

International Search Report and Written Opinion in related PCT Application No. PCT/CN2021/088675 dated Jan. 19, 2022 (7 pages).

(Continued)

*Primary Examiner* — S M Sohel Imtiaz
(74) *Attorney, Agent, or Firm* — Bayes PLLC

(57) ABSTRACT

A memory device includes a plurality of memory cells. Each memory cell includes at least one transistor and at least one capacitor electrically coupled to the at least one transistor. Each capacitor includes a first electrode, a second electrode surrounding at least a first portion of the first electrode, and a ferroelectric layer disposed between the first electrode and the second electrode.

18 Claims, 28 Drawing Sheets

100

(56) References Cited

U.S. PATENT DOCUMENTS

| | | | | |
|---|---|---|---|---|
| 2007/0205449 | A1* | 9/2007 | Ishida | H10B 53/00 257/295 |
| 2009/0068763 | A1* | 3/2009 | Noda | H10B 53/30 257/E21.001 |
| 2019/0318774 | A1* | 10/2019 | Kittl | H10B 53/30 |
| 2022/0005829 | A1* | 1/2022 | Hu | H10B 53/00 |
| 2022/0139931 | A1* | 5/2022 | Ocker | G11C 11/2275 257/295 |

FOREIGN PATENT DOCUMENTS

| | | | |
|---|---|---|---|
| CN | 101930996 | A | 12/2010 |
| CN | 109037219 | A | 12/2018 |
| CN | 111968981 | A | 11/2020 |
| CN | 112542460 | A | 3/2021 |
| EP | 3618070 | A2 | 3/2020 |
| JP | 2011124447 | A | 6/2011 |
| TW | 201804470 | A | 2/2018 |
| TW | 201820328 | A | 6/2018 |
| TW | 201917870 | A | 5/2019 |
| TW | 202005055 | A | 1/2020 |
| TW | 202018769 | A | 5/2020 |
| TW | 202044550 | A | 12/2020 |

OTHER PUBLICATIONS

First Office Action in related Taiwan Application No. 111115124 dated Feb. 10, 2023 (8 pages).

Second Office Action in related Taiwan Application No. 111115124 dated Jun. 9, 2023 (6 pages).

Office Action in related Chinese Application No. 202180097020.3 dated Mar. 23, 2026 (7 pages).

* cited by examiner

100

100

100

100

100

100

200

200

200

200

FERROELECTRIC MEMORY DEVICE AND METHOD FOR FORMING THE SAME

CROSS-REFERENCE TO RELATED APPLICATION

This application is a continuation of International Application No. PCT/CN2021/088675, filed on Apr. 21, 2021. The entire contents of the above-referenced application are expressly incorporated herein by reference.

BACKGROUND

Embodiments of the present disclosure relate to ferroelectric memory devices and fabrication methods thereof.

The demand for non-volatile memory that has low operational voltage, low power consumption, and high-speed operation suitable for various electronic equipment, such as portable terminals and integrated circuit (IC) cards, has increased. Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and great maximum read/write endurance.

SUMMARY

Ferroelectric memory devices and fabrication methods thereof are disclosed herein.

In one aspect, a memory device is disclosed. The memory device includes a plurality of memory cells. Each memory cell includes at least one transistor and at least one capacitor electrically coupled to the at least one transistor. Each capacitor includes a first electrode, a second electrode surrounding at least a first portion of the first electrode, and a ferroelectric layer disposed between the first electrode and the second electrode.

In some embodiments, the second electrode includes a second portion and a third portion, and the first portion of the first electrode is substantially parallel to the second portion and the third portion of the second electrode. In some embodiments, the first portion of the first electrode is sandwiched between the second portion of the second electrode and the third portion of the second electrode. In some embodiments, the first portion of the first electrode, the second portion of the second electrode, and the third portion of the second electrode extend substantially vertically above the transistor.

In some embodiments, the first electrode includes a first surface and a second surface opposite to the first surface. The first surface of the first portion of the first electrode is substantially parallel to the second electrode, and the second surface of the first portion of the first electrode is substantially parallel to the second electrode.

In some embodiments, the first electrode includes a first branch and a second branch, and the second electrode includes a third branch surrounding the first branch of the first electrode, and a fourth branch surround the second branch of the first electrode. In some embodiments, the ferroelectric layer is disposed between the first branch of the first electrode and the third branch of the second electrode, and between the second branch of the first electrode and the fourth branch of the second electrode. In some embodiments, the first branch of the first electrode is substantially parallel to the third branch of the second electrode, and the second branch of the first electrode is substantially parallel to the fourth branch of the second electrode.

In another aspect, a method for forming a ferroelectric memory cell is disclosed. A stack structure having a first conductive layer, a first ferroelectric material layer, and a second conductive layer is formed in an opening formed in a substrate. A bottom portion of the second conductive layer in the opening is removed to expose a portion of the first ferroelectric material layer. A second ferroelectric material layer is conformally formed over the second conductive layer and the exposed first ferroelectric material layer. A bottom portion of the second ferroelectric material layer and a bottom portion of the first ferroelectric material layer are removed to expose a portion of the first conductive layer. A third conductive layer is conformally formed over the second ferroelectric material layer and the exposed first conductive layer. The third conductive layer electrically couples the first conductive layer.

In some embodiments, a dielectric layer is formed over the third conductive layer, and a planarization operation is performed to remove a portion of the dielectric layer, a portion of the third conductive layer, and a portion of the second ferroelectric material layer to expose the second conductive layer. In some embodiments, a first planarization operation is performed to remove the portion of the dielectric layer and the portion of the third conductive layer, and a second planarization operation is performed to remove the portion of the second ferroelectric material layer. In some embodiments, an electrode is formed on the second conductive layer, and the electrode electrically couples the second conductive layer.

In some embodiments, an etch operation is performed by using the first ferroelectric material layer as an etch stop layer to remove the bottom portion of the second conductive layer. In some embodiments, a photolithography operation is performed on the second conductive layer to remove the bottom portion of the second conductive layer.

In still another aspect, a method for forming a ferroelectric memory cell is disclosed. A first dielectric layer is formed on a substrate. A second dielectric layer is formed on the first dielectric layer, and the first dielectric layer and the second dielectric layer include different materials. An opening is formed in the second dielectric layer and the first dielectric layer. A first conductive layer is conformally formed in the opening. The second dielectric layer is removed to expose the first dielectric layer. A first ferroelectric material layer and a second conductive layer are conformally formed over the first conductive layer and the exposed first dielectric layer. The first conductive layer extends substantially vertically above the substrate, and the first ferroelectric material layer and the second conductive layer surround at least a portion of the first conductive layer.

In some embodiments, a semiconductor layer is formed covering the second conductive layer. In some embodiments, the first conductive layer is formed on a top surface of the second dielectric layer and a sidewall of the opening, and a planarization operation is performed to remove the first conductive layer on the top surface of the second dielectric layer.

In some embodiments, the first dielectric layer includes silicon nitride. In some embodiments, the second dielectric layer includes silicon oxide. In some embodiments, the first conductive layer includes titanium nitride, and the second conductive layer includes titanium nitride.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

DETAILED DESCRIPTION

Figure 1:
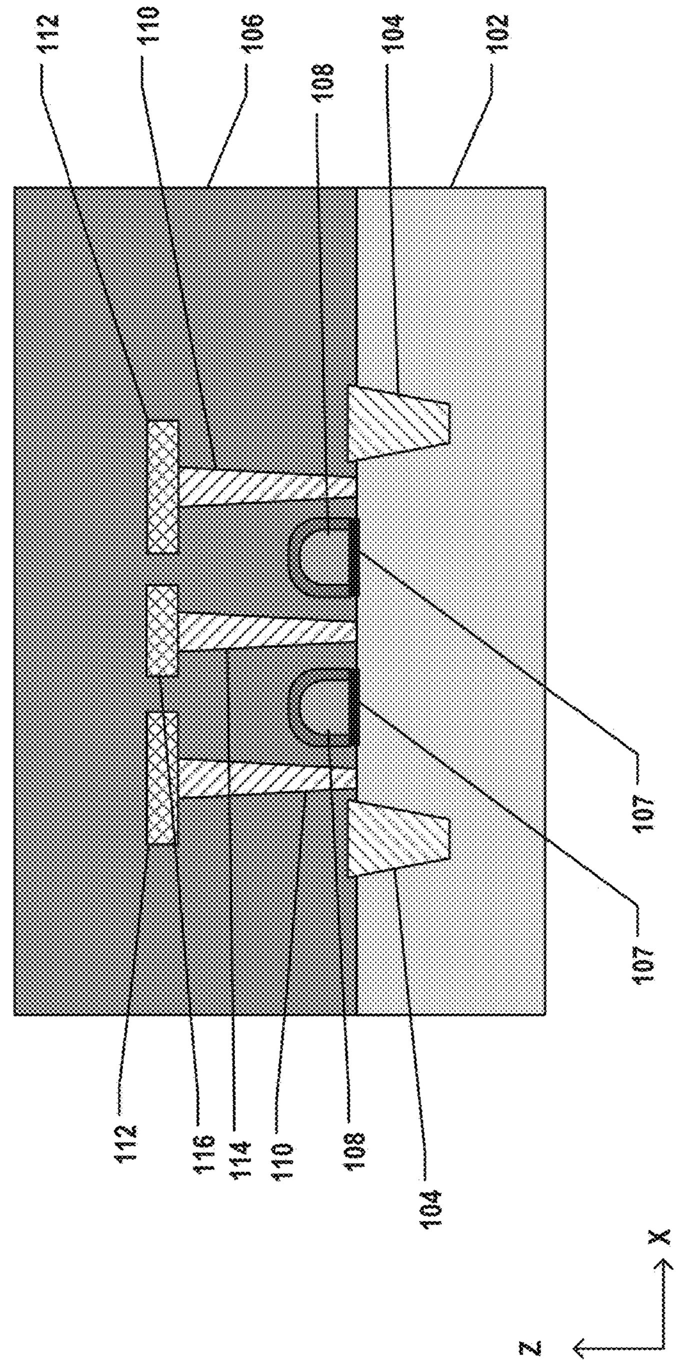
FIGS. 1-15 illustrate cross-sections of an exemplary ferroelectric memory cell of a memory device at different stages of a manufacturing process, according to some aspects of the present disclosure.

Although configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a." "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. In some embodiments, the substrate can be made from an electrically non-conductive material, such as glass, plastic, or sapphire wafer.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a "side surface" can generally refer to a surface on the exterior of an object. For example, depending on the embodiment, a side surface can be a sidewall along a horizontal direction (e.g., the x-direction) or a top/bottom surface along a vertical direction (e.g., the z-direction). As used herein, a recess refers to an open space between two boundaries. For example, depending on the embodiment, a recess can be located between two surfaces that are not coplanar with each other, e.g., having a staggered configuration.

A memory cell array of the ferroelectric memory device may include a number of bit lines and a number of word lines extending to cross with each other, and a number of memory cells may be arranged in a matrix at positions corresponding to the respective crossings of the lines. Each memory cell may include at least one memory cell transistor, in which the gate electrode of the memory cell transistor may receive a signal from the word line, and at least one ferroelectric capacitor interposed between the source region of the memory cell transistor and a cell plate line. The ferroelectric capacitor has a residual polarization characteristic to generate positive or negative residual polarizations depending on the high/low relationship between the voltage applied to the ferroelectric capacitor from the bit line via the memory cell transistor and the voltage applied to the ferroelectric capacitor from the cell plate line. Hence, one limitation of the ferroelectric memory device fabrication is the capacitance of the ferroelectric capacitor. Various embodiments in accordance with the present disclosure provide ferroelectric memory devices and fabrication methods thereof that can increase the capacitance of the ferroelectric capacitor.

Figure 27:
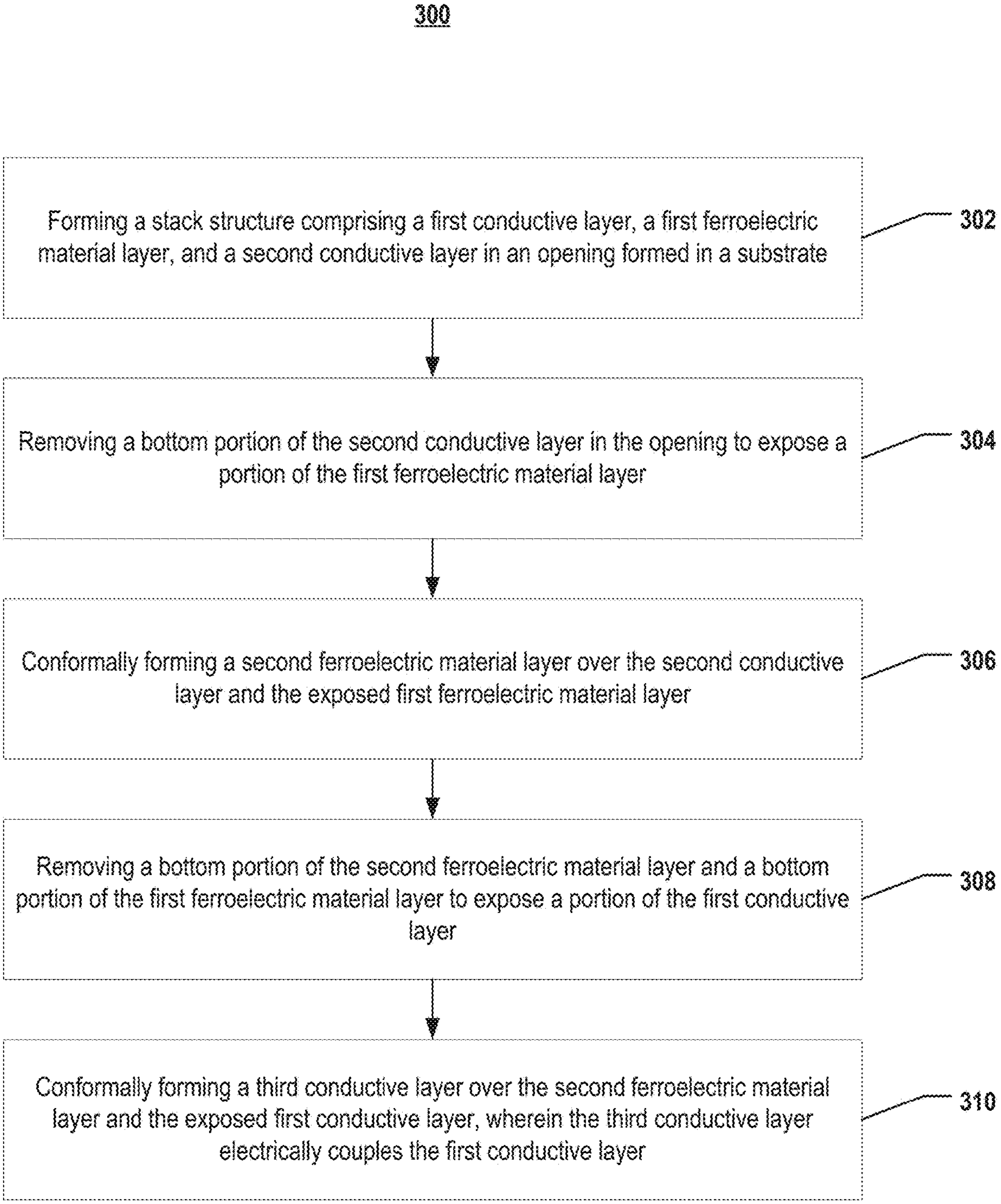
FIG. 27 illustrates a flowchart of an exemplary method for forming a memory device, according to some aspects of the present disclosure.

FIGS. 1-15 illustrate cross-sections of an exemplary ferroelectric memory cell 100 of a memory device at different stages of a manufacturing process, according to some aspects of the present disclosure. FIG. 27 illustrates a flowchart of an exemplary method 300 for forming a memory device, according to some aspects of the present disclosure. For the purpose of better explaining the present disclosure, the cross-sections of ferroelectric memory cell 100 in FIGS. 1-15 and the flowchart of method 300 in FIG. 27 will be described together. It is understood that the operations shown in method 300 are not exhaustive and that other operations can be performed as well before, after, or between any of the illustrated operations. Further, some of the operations may be performed simultaneously, or in a different order than shown in FIGS. 1-15 and FIG. 27.

The memory device may include a plurality of ferroelectric memory cells 100, and each ferroelectric memory cell 100 may be the storage element of the memory device, e.g., a ferroelectric memory device, and may include various designs and configurations. FIGS. 1-15 show a "2T-2C" ferroelectric memory cell structure that includes two transistors and two capacitors. However, the amount of the transistors and/or the capacitors in ferroelectric memory cells 100 is not limited hereto, and other suitable designs of ferroelectric memory cell structures, e.g., 1T-1C or nT-nC ferroelectric memory cell, are in the scope of the present disclosure.

As shown in FIG. 1, ferroelectric memory cell 100 includes a substrate 102 and insulating layers 104 formed in substrate 102 to separate and insulate ferroelectric memory cell 100 with adjacent devices or adjacent ferroelectric memory cells. Substrate 102 may include silicon (e.g., single crystalline silicon), silicon germanium (SiGe), gallium arsenide (GaAs), germanium (Ge), silicon on insulator (SOI), or other suitable materials. Insulating layers 104 may be local oxidation of silicon (LOCOS) insulation layer, or other suitable materials.

A gate stack having a gate dielectric 107 and a gate conductor 108 is formed on substrate 102, and source/drain regions (not shown) are formed in substrate 102. Source/drain regions may be doped portions in substrate 102 with n-type or p-type dopants at a desired doping level. Gate dielectric 107 may include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 108 may include conductive materials including, but not limited to, tungsten (W), cobalt (Co), copper (Cu), Al, polysilicon, silicide, or any combination thereof. Gate conductor 108 may function as the word line of ferroelectric memory cell 100. An interconnect 114 and a conductive plate 116 may be in contact with one of the source/drain regions and function as a path to the bit lines of ferroelectric memory cell 100. An interconnect 110 and a conductive plate 112 may be in contact with the other side of the source/drain regions and electrically coupled to an electrode of a capacitor formed in subsequent operations. In some embodiments, interconnects 110, interconnect 114, conductive plates 112 and conductive plate 116 may include Cu, titanium nitride (TiN) or W. Substrate 102, insulating layers 104, gate stack, interconnects 110, interconnect 114, conductive plates 112 and conductive plate 116 are covered by an interlayered dielectric (ILD) layer 106, such as $SiO_x$ or $SiN_x$.

Figure 2:
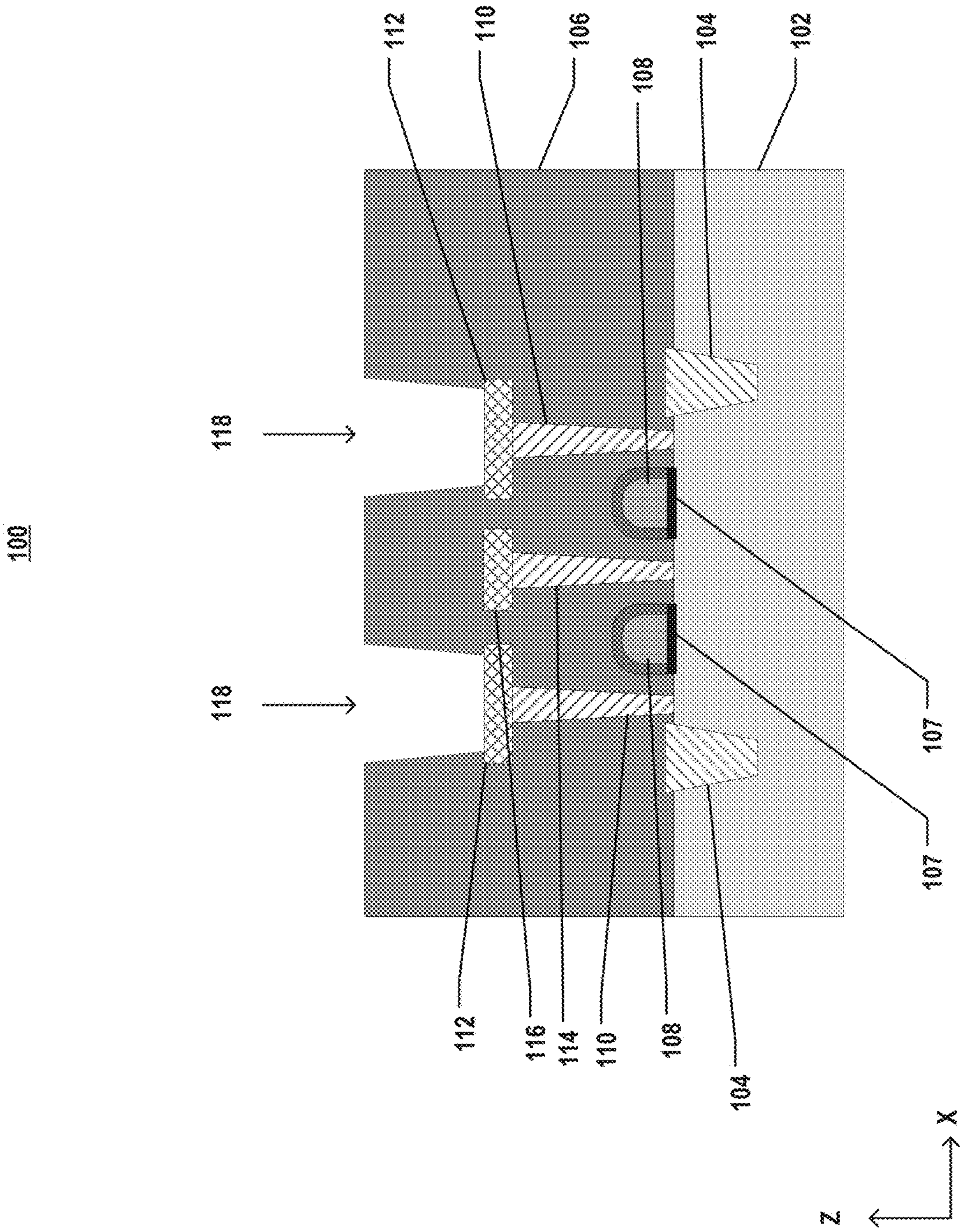

As shown in FIG. 2, openings 118 are formed in ILD layer 106 to expose the top surface of conductive plates 112. Openings 118 may be formed by dry etch, wet etch, or other suitable processes.

Figure 3:
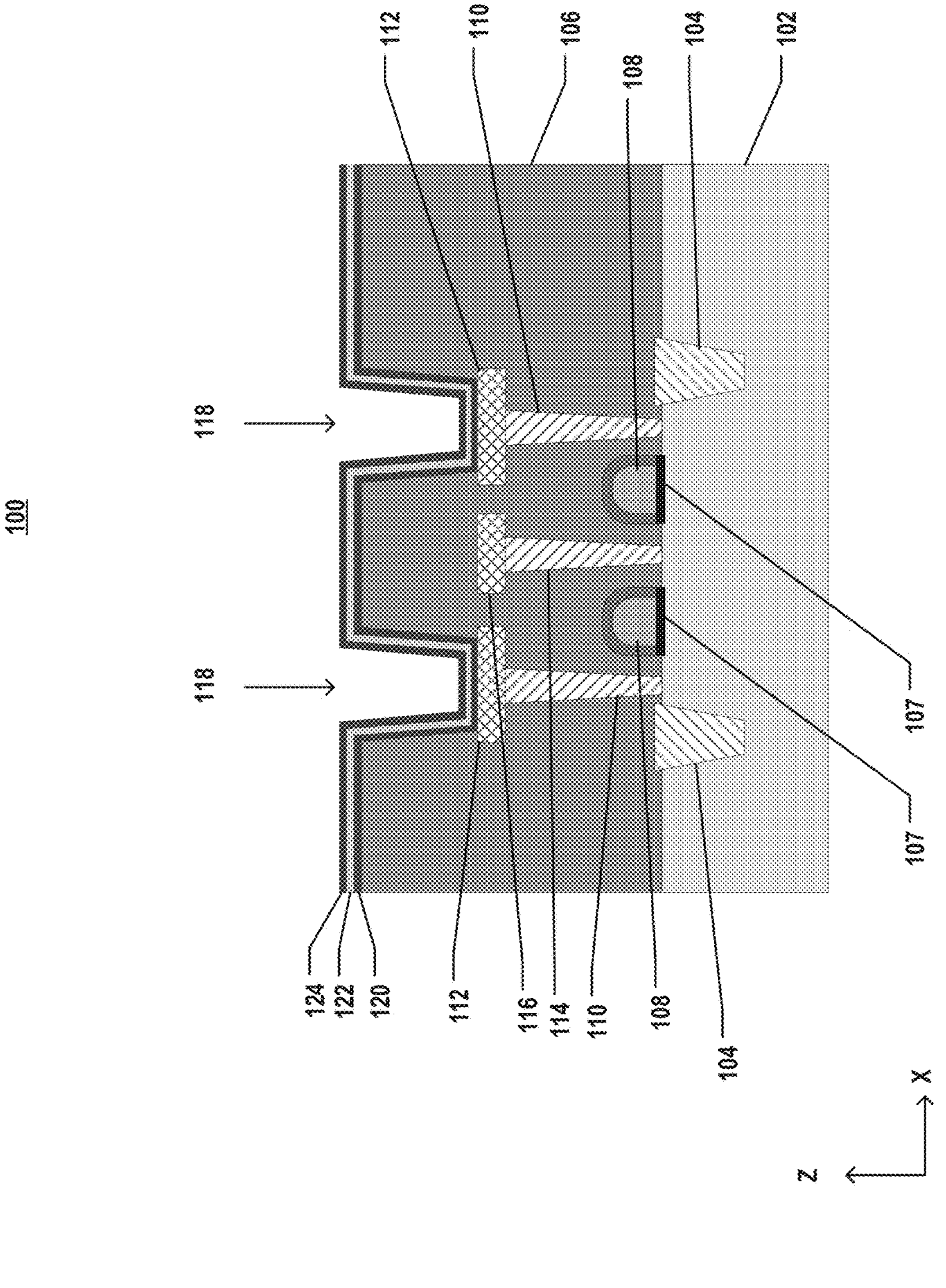

Then, as shown in FIG. 3 and operation 302 of FIG. 27, a first conductive layer 120, a first ferroelectric material layer 122, and a second conductive layer 124 are sequentially and conformally formed in openings 118. First conductive layer 120 electrically contacts conductive plates 112. In some embodiments, first conductive layer 120 and second conductive layer 124 may include TiN, titanium silicon nitride ($TiSiN_x$), titanium aluminum nitride ($TiAlN_x$), titanium carbon nitride ($TiCN_x$), tantalum nitride ($TaN_x$), tantalum silicon nitride ($TaSiN_x$), tantalum aluminum nitride ($TaAlN_x$), tungsten nitride ($WN_x$), tungsten silicide ($WSi_x$), tungsten carbon nitride ($WCN_x$), ruthenium (Ru), ruthenium oxide ($RuO_x$), iridium (Ir), doped polysilicon, transparent conductive oxides (TCO), iridium oxide ($IrO_x$), or other suitable materials. In some embodiments, first conductive layer 120 and second conductive layer 124 may include the same material(s). In some embodiments, first conductive layer 120 and second conductive layer 124 may include different materials.

In some embodiments, first conductive layer 120 and second conductive layer 124 may be formed by atomic layer deposition (ALD), physical vapor deposition (PVD), chemical vapor deposition (CVD), electrochemical deposition, pulsed laser deposition (PLD), or other suitable processes. In some embodiments, first conductive layer 120 and second conductive layer 124 may have a thickness between about 2 nm and about 50 nm. In some embodiments, first conductive layer 120 and second conductive layer 124 may have the same thickness. In some embodiments, first conductive layer 120 and second conductive layer 124 may have different thicknesses.

In some embodiments, first ferroelectric material layer 122 may include a ferroelectric oxide material. The ferroelectric oxide may be doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, first ferroelectric material layer 122 may include a multi-layer structure.

In some embodiments, first ferroelectric material layer 122 may include a ferroelectric composite oxide. In some embodiments, first ferroelectric material layer 122 may include oxygen and one or more ferroelectric metals. The ferroelectric metals can include, but not limited to, zirconium (Zr), hafnium (Hf), titanium (Ti), aluminum (Al), or other suitable materials. In some embodiments, first ferroelectric material layer 122 may include oxygen and two or more ferroelectric metals. In some embodiments, first ferroelectric material layer 122 may include oxygen and a non-metal material such as silicon (Si).

In some embodiments, first ferroelectric material layer 122 may also include a plurality of dopants formed as a part of the crystal structures. In some embodiments, the dopants compensate for the defects formed during the crystallization of the ferroelectric oxide material to improve the film quality of first ferroelectric material layer 122. In some embodiments, the dopants are different from the ferroelectric metals in the ferroelectric oxide material and include one or more dopants from one or more of Hf, Zr, Ti, Al, Si, hydrogen (H), oxygen (O), vanadium (V), niobium (Nb), tantalum (Ta), yttrium (Y), and/or lanthanum (La).

Figure 4:
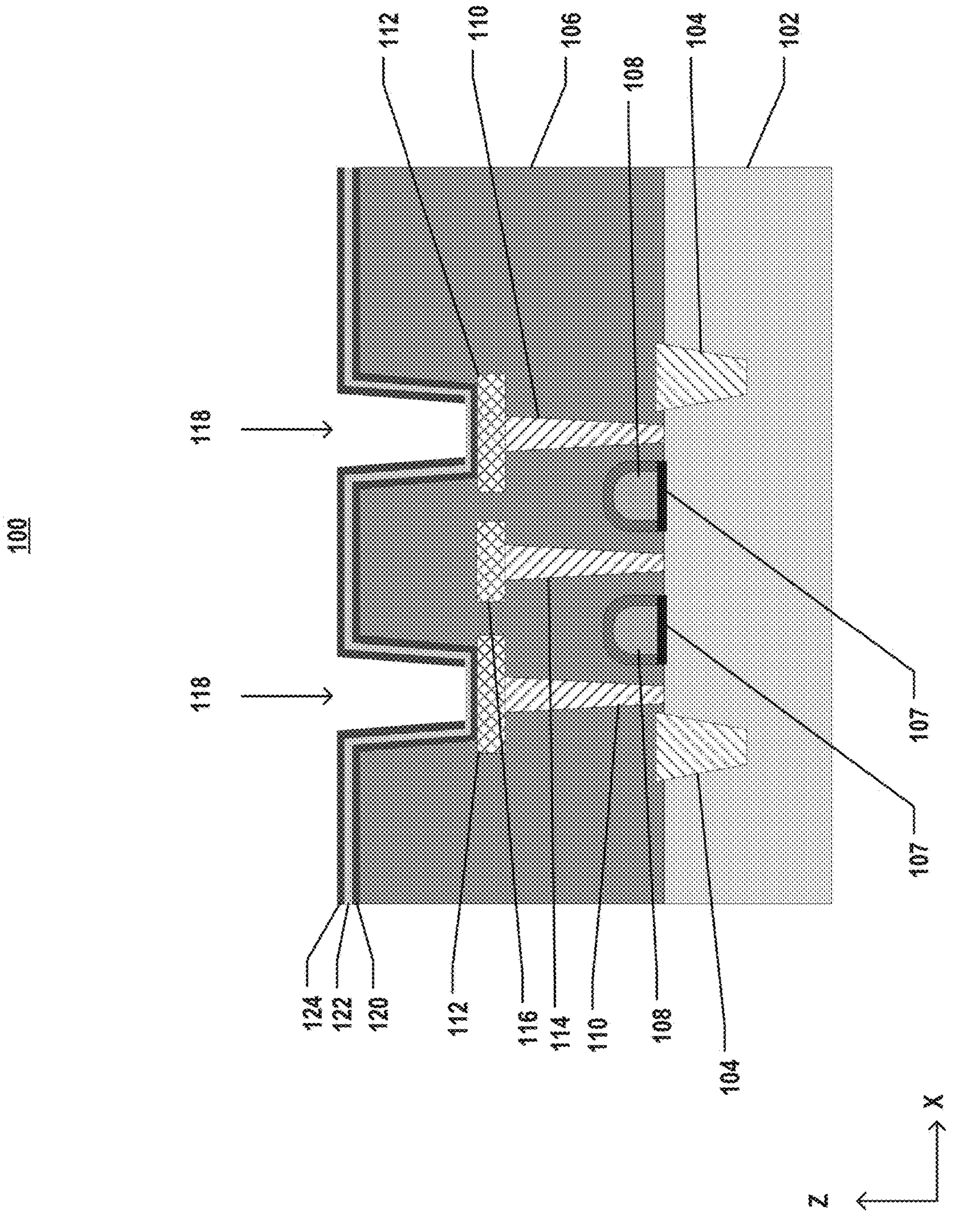

As shown in FIG. 4 and operation 304 of FIG. 27, a bottom portion of second conductive layer 124 in openings 118 is removed to expose a portion of first ferroelectric material layer 122. In some embodiments, a blanket etch operation may be performed to remove the bottom portion of second conductive layer 124 in openings 118. The blanket etch operation may be dry etch, or other suitable processes. In some embodiments, a protection layer, e.g., a silicon nitride layer or a hard mask, may be formed on second conductive layer 124 and exposes the bottom portion of second conductive layer 124. Then, the bottom portion of second conductive layer 124 may be removed by dry etch, wet etch, or other suitable processes.

Figure 5:
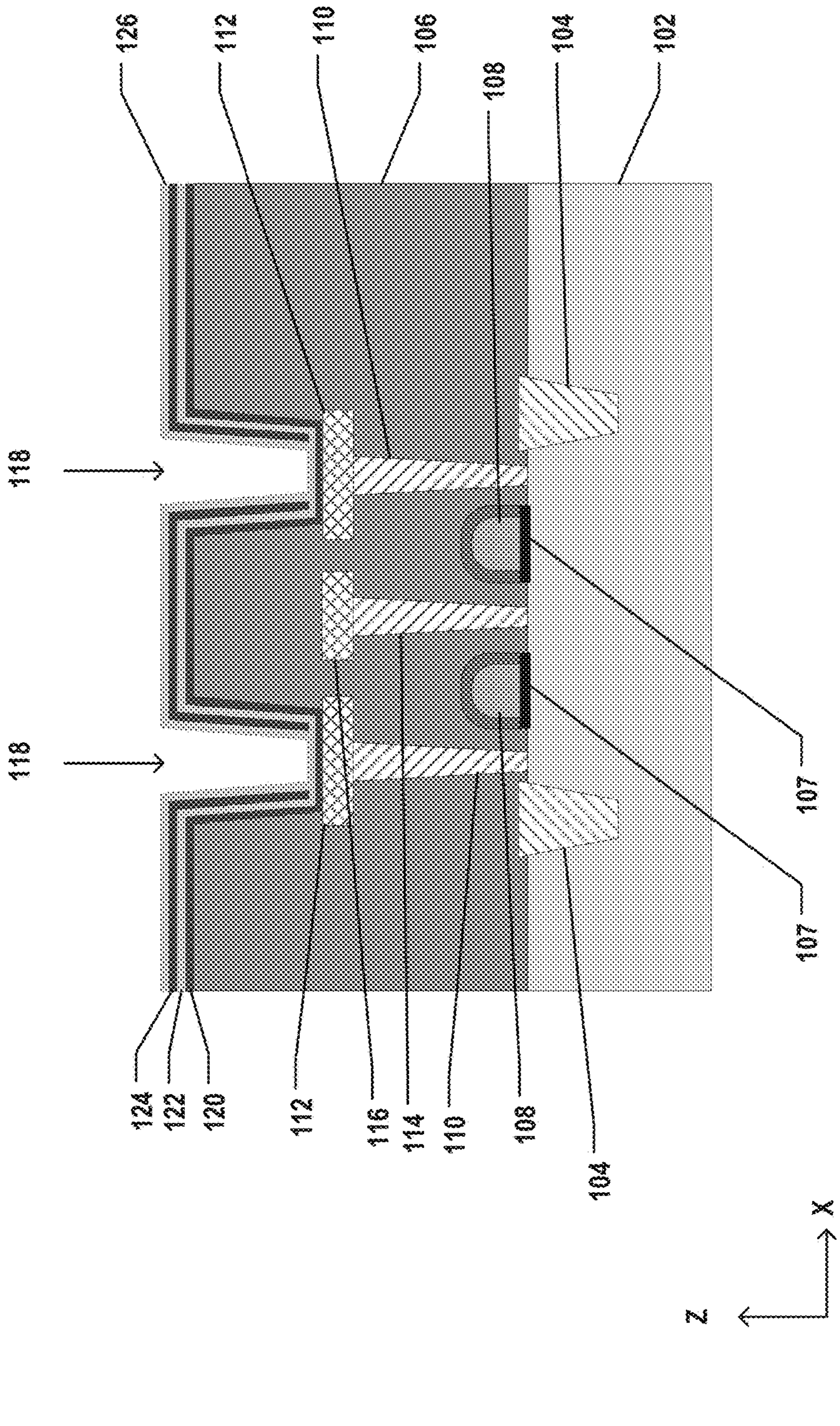

As shown in FIG. 5 and operation 306 of FIG. 27, a second ferroelectric material layer 126 is conformally formed over second conductive layer 124 and the exposed first ferroelectric material layer 122. A bottom portion of second ferroelectric material layer 126 is coupled to the exposed portion of first ferroelectric material layer 122. In some embodiments, second ferroelectric material layer 126 may include the same material as first ferroelectric material layer 122. In some embodiments, first ferroelectric material layer 122 and second ferroelectric material layer 126 may include different materials.

Figure 6:
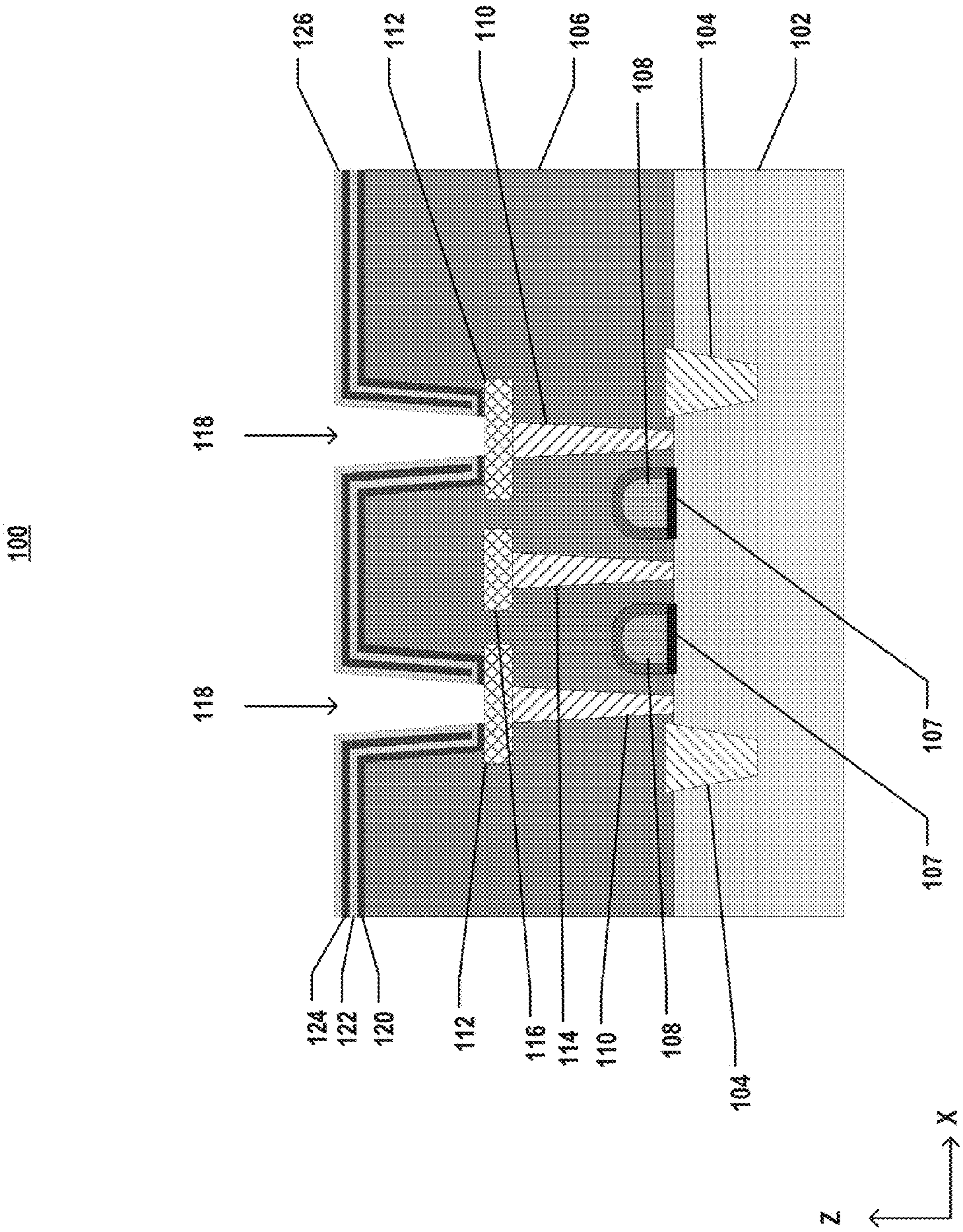

As shown in FIG. 6 and operation 308 of FIG. 27, a bottom portion of second ferroelectric material layer 126 and a bottom portion of first ferroelectric material layer 122 are removed to expose a portion of first conductive layer 120. In some embodiments, a bottom portion of first conductive layer 120 in openings 118 may be removed, and the portion of first conductive layer 120 on sidewalls of openings 118 is exposed, as shown in FIG. 6. In some embodiments, the bottom portion of first conductive layer 120 in openings 118 may be partially removed or not removed, and the bottom portion of first conductive layer 120 in openings 118 is exposed. In some embodiments, a blanket etch operation may be performed to remove the bottom portion of second ferroelectric material layer 126 and the bottom portion of first ferroelectric material layer 122. The blanket etch operation may be dry etch, or other suitable processes. In some embodiments, a protection layer, e.g., a silicon nitride layer or a hard mask, may be formed on second ferroelectric material layer 126 and exposes the bottom portion of second ferroelectric material layer 126. Then, the bottom portion of second ferroelectric material layer 126 and the bottom portion of first ferroelectric material layer 122 may be removed by dry etch, wet etch, or other suitable processes.

Figure 7:
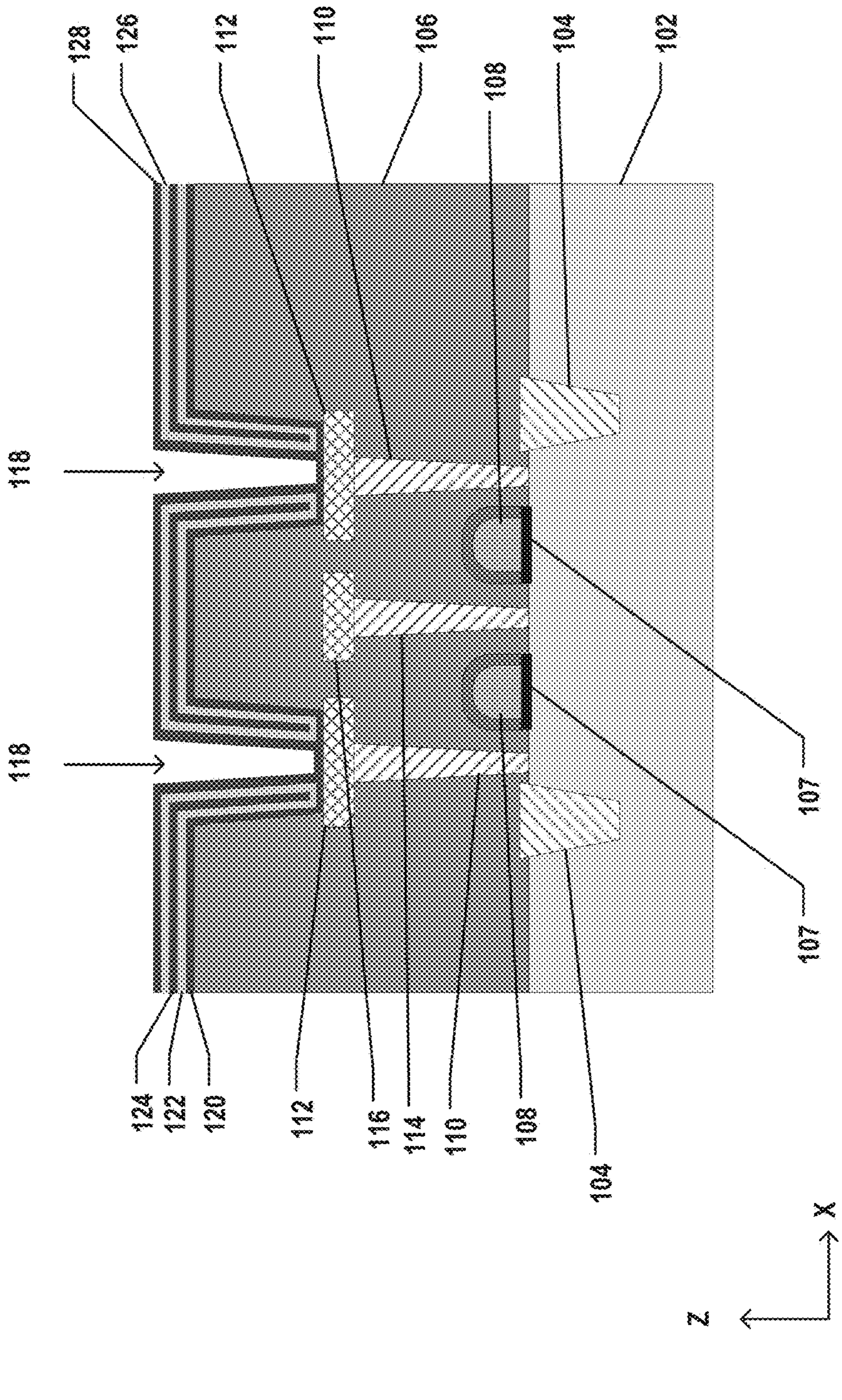

As shown in FIG. 7 and operation 310 of FIG. 27, a third conductive layer 128 is conformally formed over second ferroelectric material layer 126 and the exposed first conductive layer 120. Third conductive layer 128 electrically couples first conductive layer 120. In some embodiments, first conductive layer 120 and third conductive layer 128 may include the same material(s). In some embodiments, first conductive layer 120 and third conductive layer 128 may include different materials.

Second conductive layer 124 forms a first electrode of a capacitor, and first conductive layer 120 and third conductive layer 128 integrally form a second electrode of the capacitor. The first electrode, including second conductive layer 124, is surrounded by the second electrode, including first conductive layer 120 and third conductive layer 128. First ferroelectric material layer 122 and second ferroelectric material layer 126 integrally form a ferroelectric layer disposed between the first electrode and the second electrode.

Figure 8:
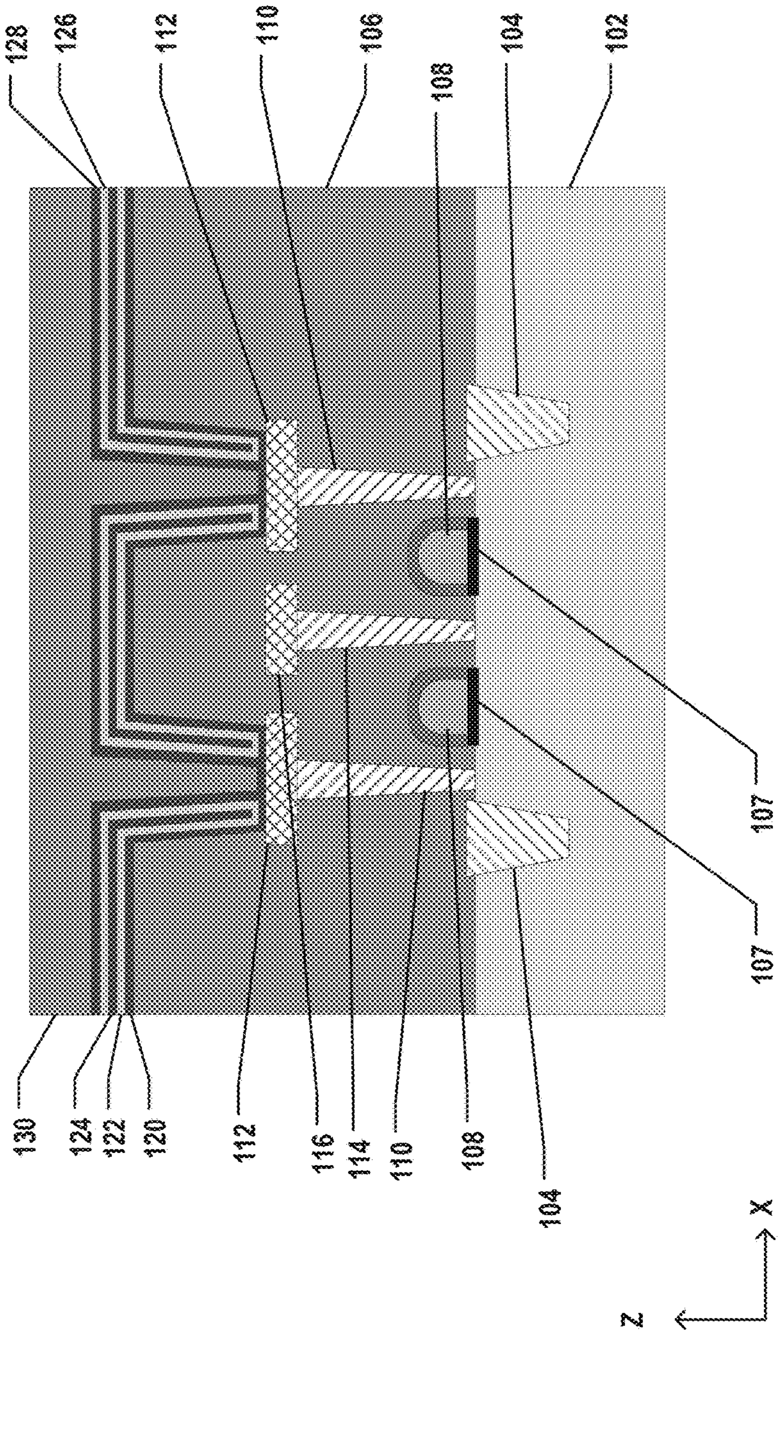
Figure 9:
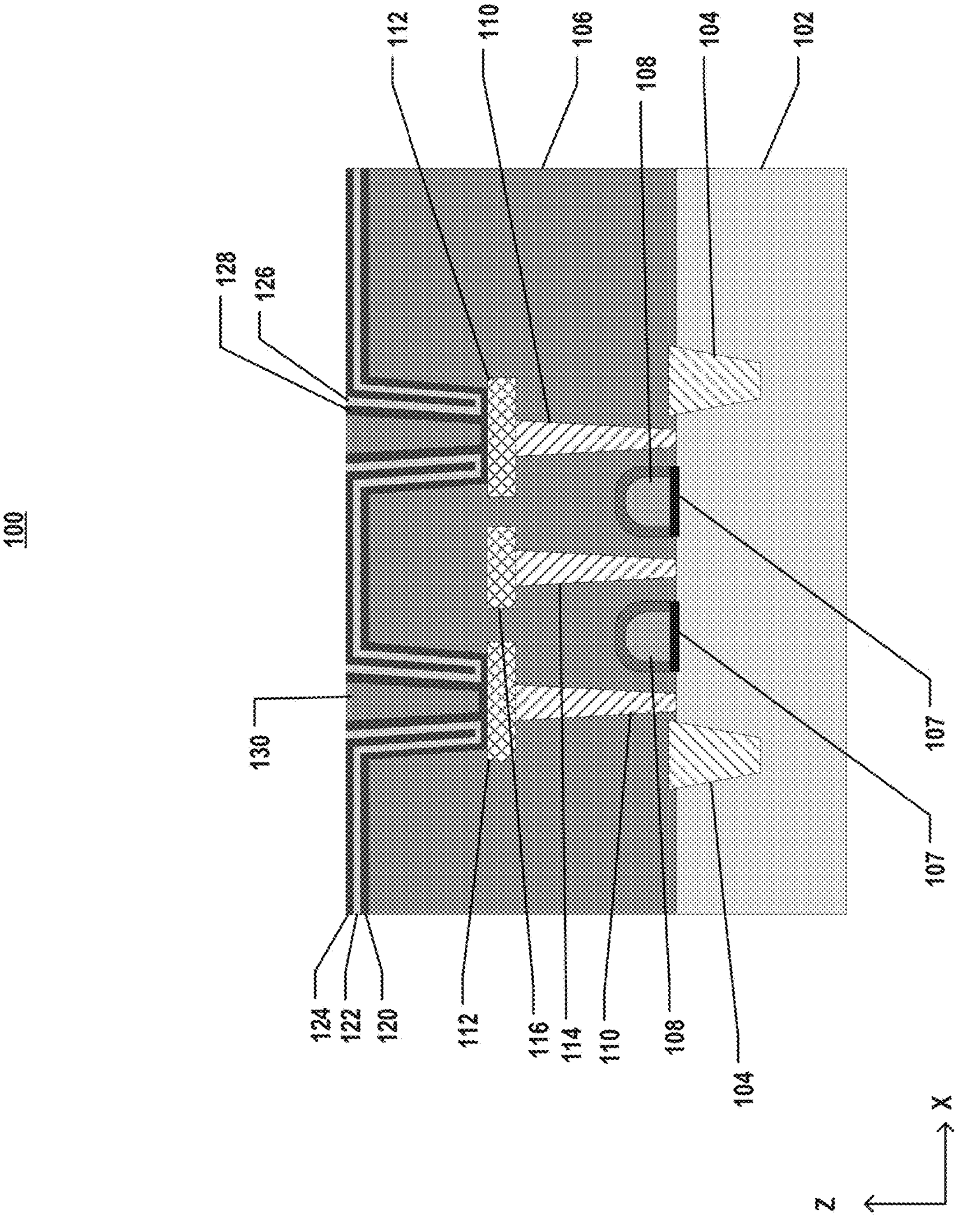

Then, as shown in FIG. 8, a dielectric layer 130 is formed over third conductive layer 128 and fills opening 118. Dielectric layer 130 may be an ILD layer, formed by $SiO_x$ or $SiN_x$. In some embodiments, dielectric layer 130 may be formed by SiGe. As shown in FIG. 9, a planarization operation is performed to remove a portion of dielectric layer 130, a portion of third conductive layer 128 and a portion of second ferroelectric material layer 126 to expose second conductive layer 124. In some embodiments, the planarization operation may include a chemical mechanical polishing (CMP) process to remove dielectric layer 130, third conductive layer 128, and second ferroelectric material layer 126. In some embodiments, the planarization operation may include two CMP processes. The first CMP process may use third conductive layer 128 as a stop layer to remove a portion of dielectric layer 130, and the second CMP process may use second conductive layer 124 as a stop layer to remove a portion of dielectric layer 130, third conductive layer 128 and second ferroelectric material layer 126. After the planarization operation, the top surfaces of second conductive layer 124, dielectric layer 130, third conductive layer 128 and second ferroelectric material layer 126 are coplanar.

Figure 10:
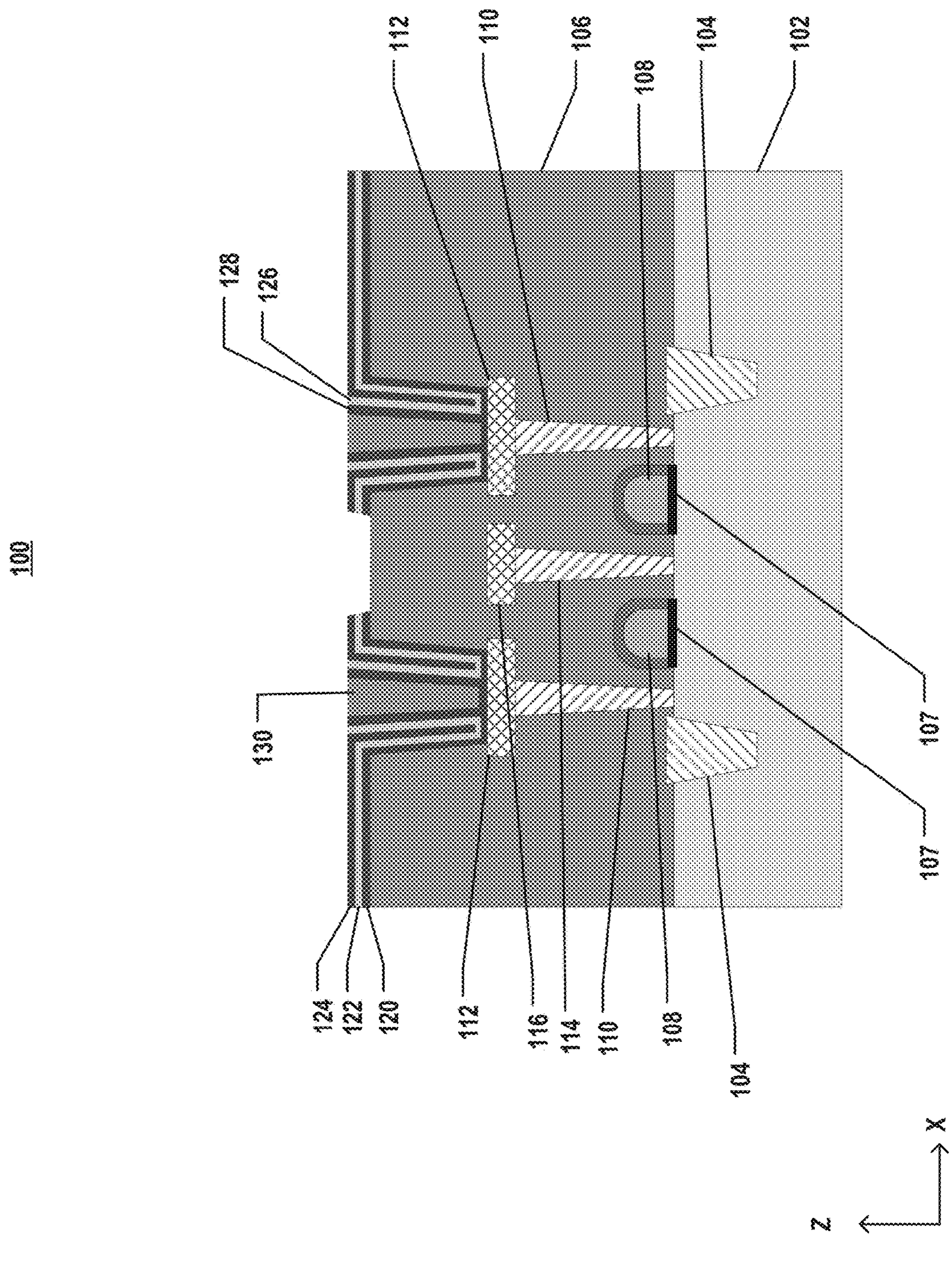
Figure 11:
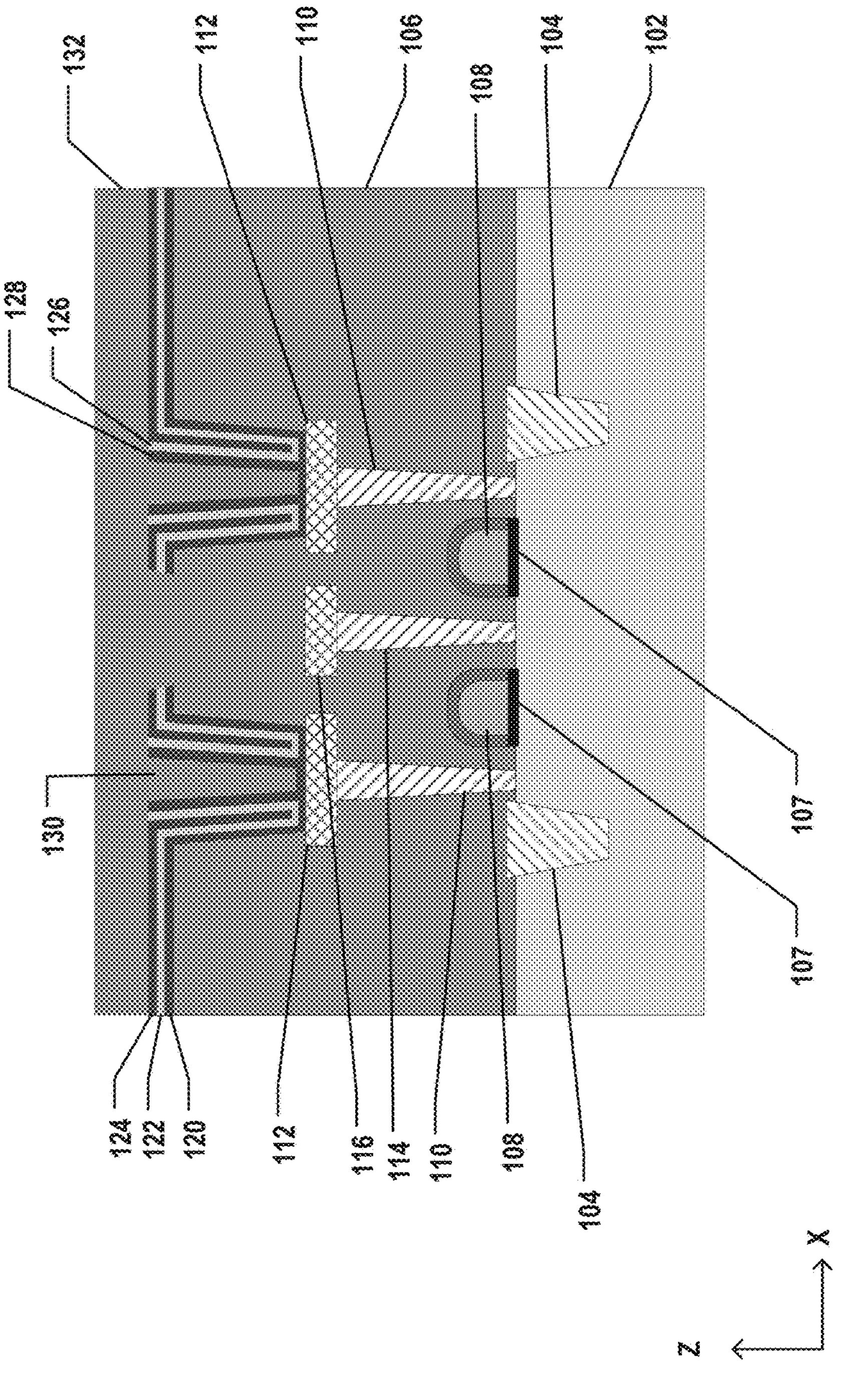

As shown in FIG. 10, a portion of the stack of first conductive layer 120, first ferroelectric material layer 122 and second conductive layer 124 is removed to isolate the stack of first conductive layer 120, first ferroelectric material layer 122 and second conductive layer 124 into two separated capacitor units, and a portion of ILD layer 106 is exposed. In some embodiments, the removal operation may be performed by dry etch, wet etch, or other suitable processes. Then, as shown in FIG. 11, a dielectric layer 132 is deposited over the exposed ILD layer 106 and second conductive layer 124. In some embodiments, dielectric layer 132, dielectric layer 130, and ILD layer 106 may include the same material. In some embodiments, dielectric layer 132, dielectric layer 130, and ILD layer 106 may include different materials.

Figure 12:
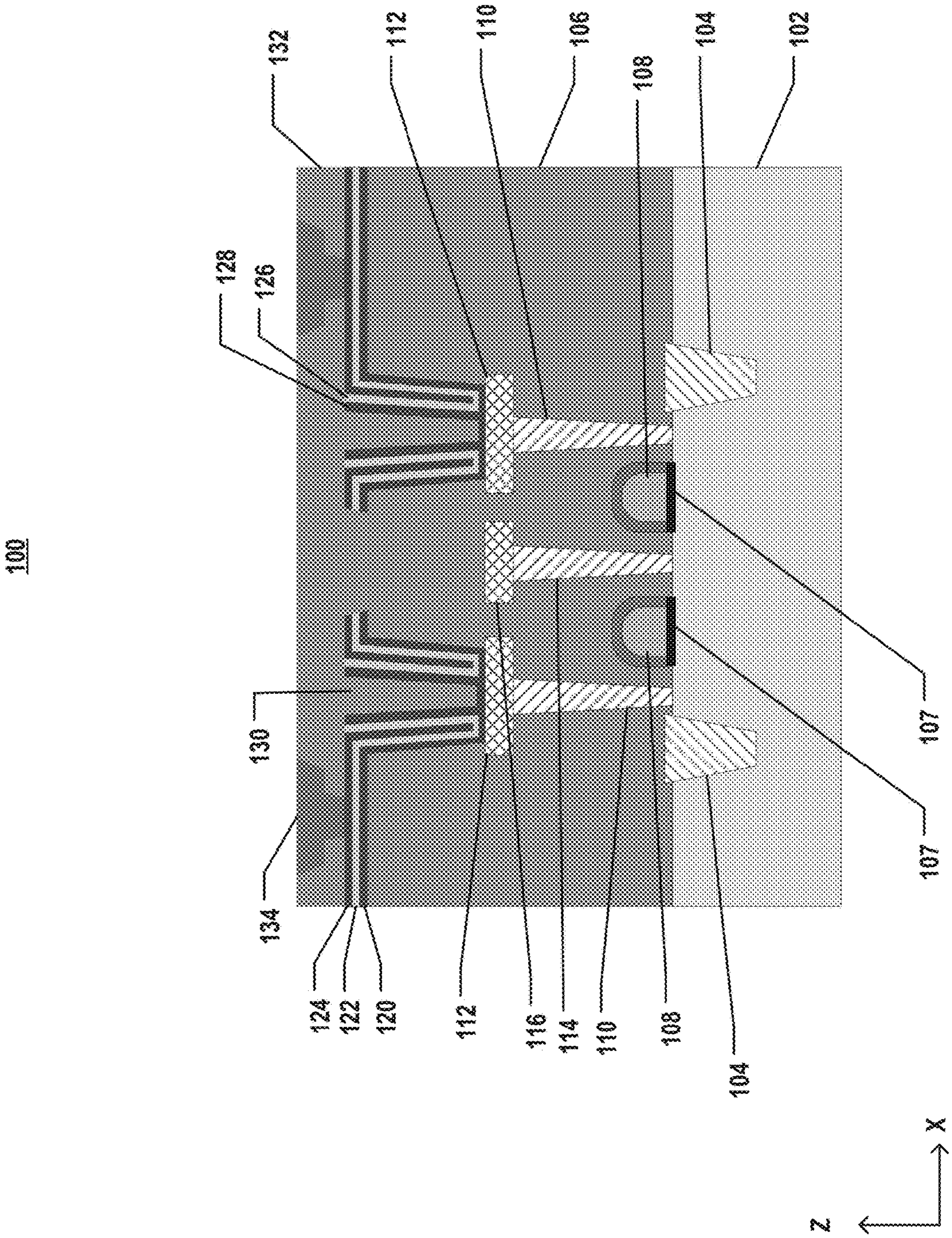

The memory device may have two different bit line structures, capacitor over bit line (COB) and capacitor under bit line (CUB). In some embodiments, when the memory device is a COB structure, a plate line 134 is formed in dielectric layer 132 electrically coupling the second electrode of the capacitor, second conductive layer 124, as shown in FIG. 12. Conductive plate 116 may function as the bit line, and conductive plate 112 may be coupled to the first electrode of the capacitor, including first conductive layer 120 and third conductive layer 128. Conductive plate 112 connects the second electrode of the capacitor formed by first conductive layer 120 and third conductive layer 128 integrally. Plate line 134 connects to the first electrode of the capacitor formed by second conductive layer 124. The ferroelectric layer, formed by first ferroelectric material layer 122 and second ferroelectric material layer 126 integrally, is disposed between the first electrode and the second electrode. Since the second electrode surrounds the first electrode and the area of the second electrode is increased, the capacitance of the capacitor could be increased accordingly.

Figure 13:
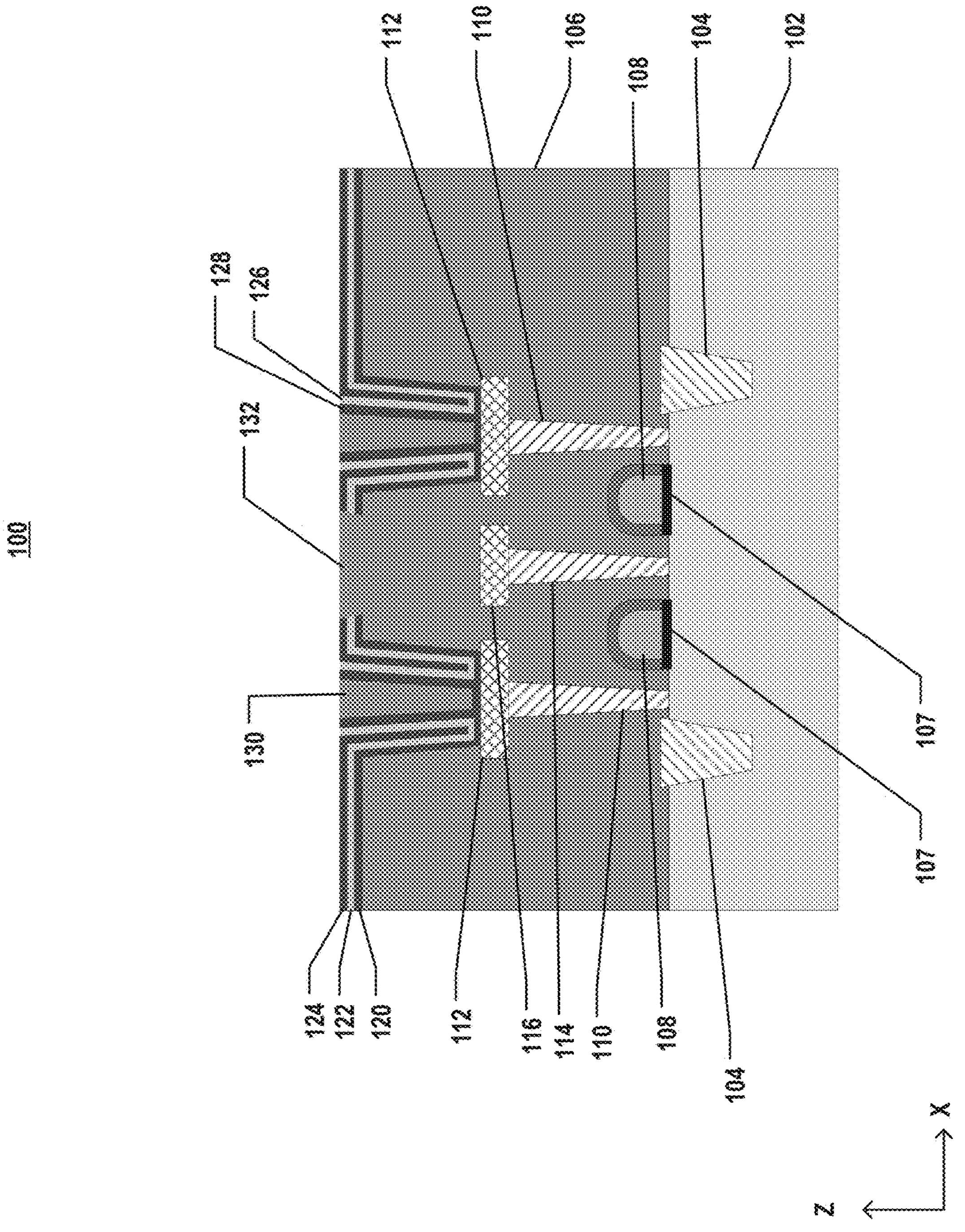
Figure 14:
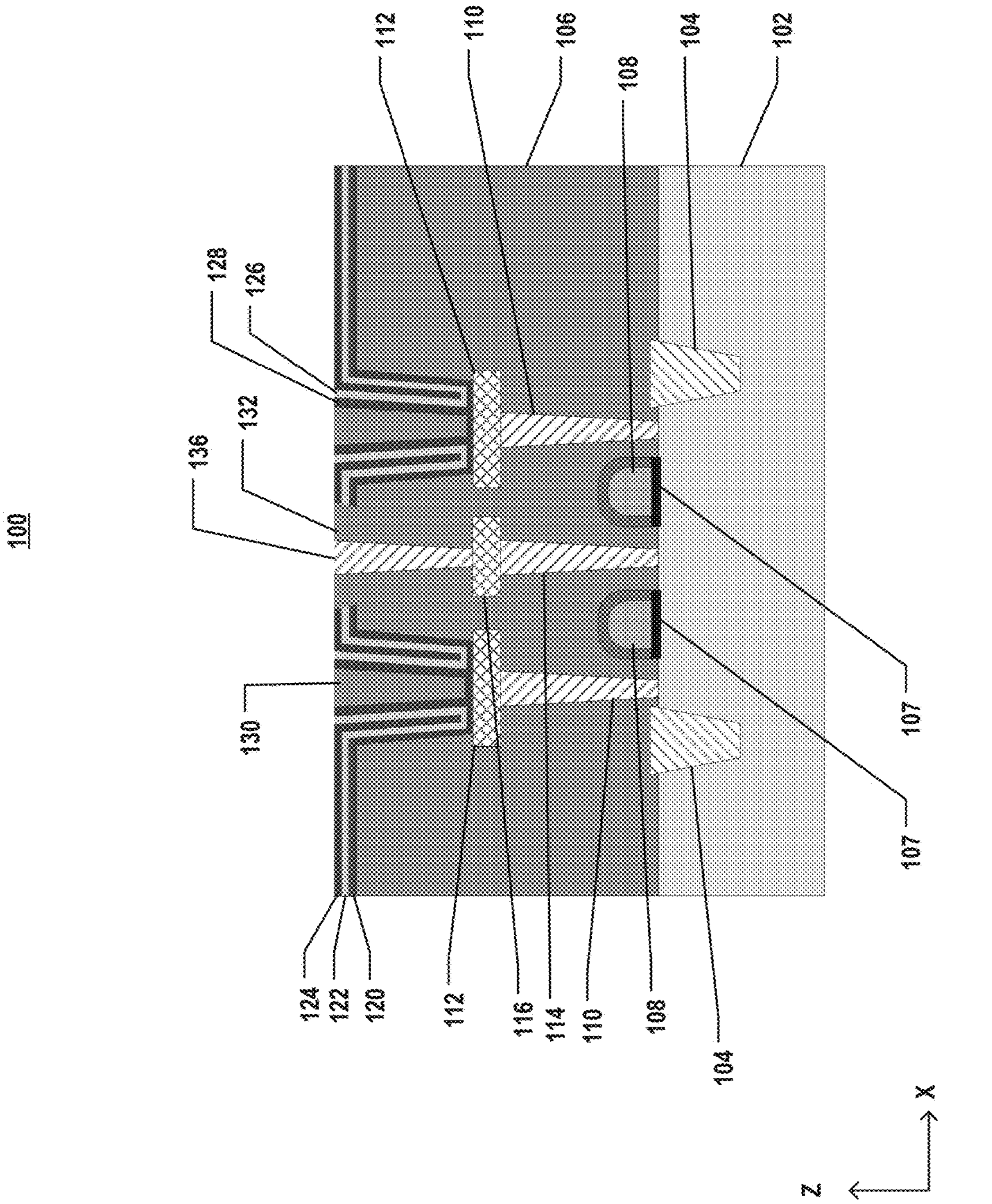
Figure 15:
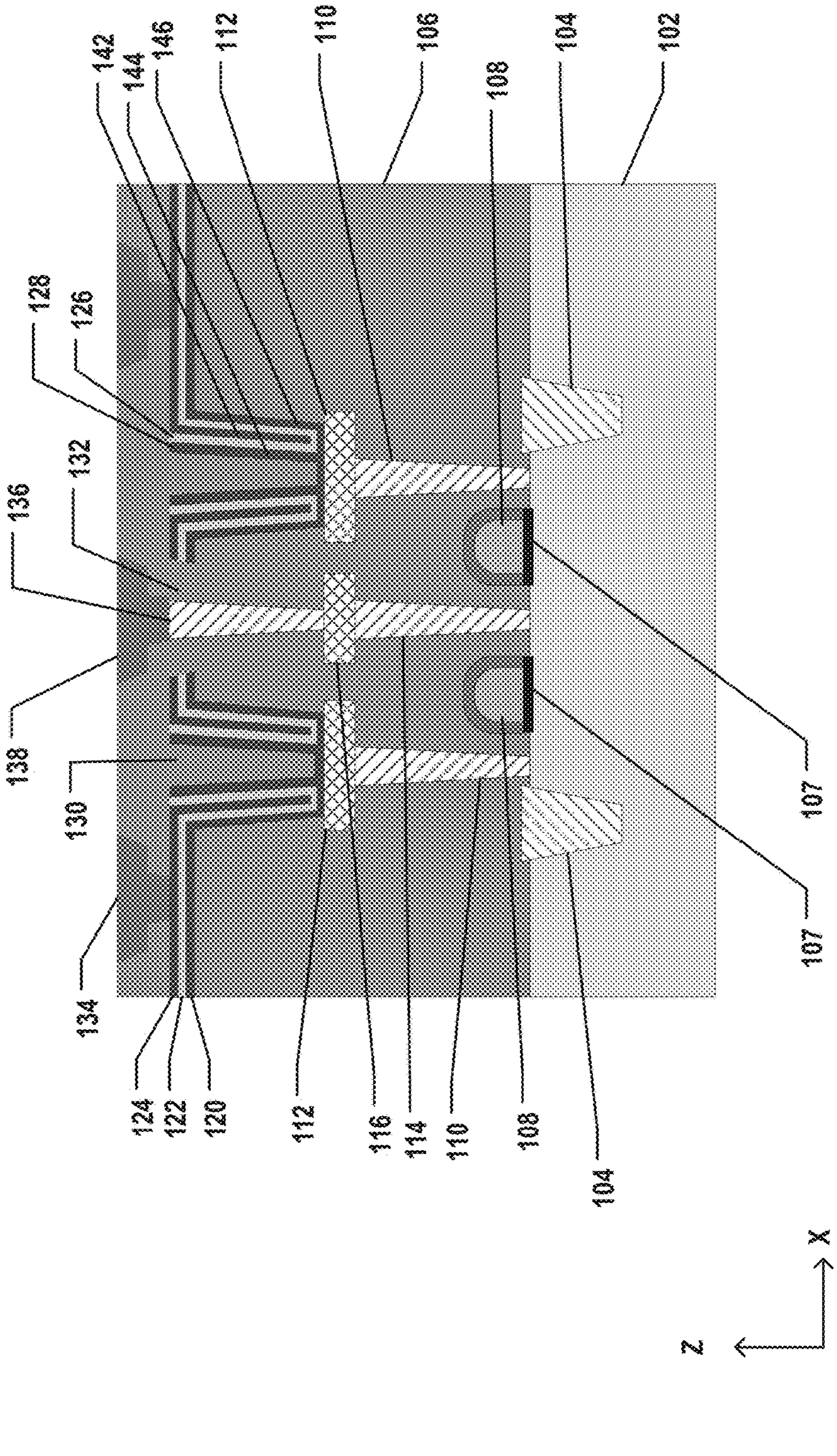

In some embodiments, when the memory device is a CUB structure, after forming dielectric layer 132, a planarization operation, e.g., a CMP process, may be performed to remove a portion of dielectric layer 132 and expose the top surface of second conductive layer 124, as shown in FIG. 13. Then, a bit line interconnect 136 is formed in ILD layer 106 and dielectric layer 132 to electrically connect conductive plate 116, as shown in FIG. 14. Bit line interconnect 136 may be formed by a series of photolithography process, etch process, deposition process or other suitable processes, to form a conductive interconnect on conductive plate 116. As shown in FIG. 15, a bit line 138 is formed on bit line interconnect 136, and plate line 134 is formed and electrically connected to the first electrode of the capacitor formed by second conductive layer 124.

The capacitor includes the first electrode having a first portion 142, and the second electrode having a second portion 144 and a third portion 146. As shown in FIG. 15, second portion 144 and third portion 146 surround first portion 142, and first portion 142 of the first electrode is substantially parallel to second portion 144 and third portion 146 of the second electrode. In other words, first portion 142 of the first electrode is sandwiched between second portion 144 and third portion 146 of the second electrode.

Furthermore, first portion 142 of the first electrode and second portion 144 and third portion 146 of the second electrode extend substantially vertically above conductive plate 112 or above the transistor. Each capacitor of ferroelectric memory cell 100 in FIG. 15 includes a left branch and a right branch, and each branch includes a sandwiched structure form by the first electrode and the second electrode. In some embodiments, the second electrodes of the left branch and the right branch are electrically coupled. Furthermore, the left branch and the right branch are electrically coupled through a portion of the third conductive layer 128. The portion of the third conductive layer 128 connecting the left branch and the right branch of the capacitor comprises the same material with the first electrode. Since the second electrode surrounds the first electrode and the area of the second electrode is increased, the capacitance of the capacitor could be increased accordingly.

Figure 28:
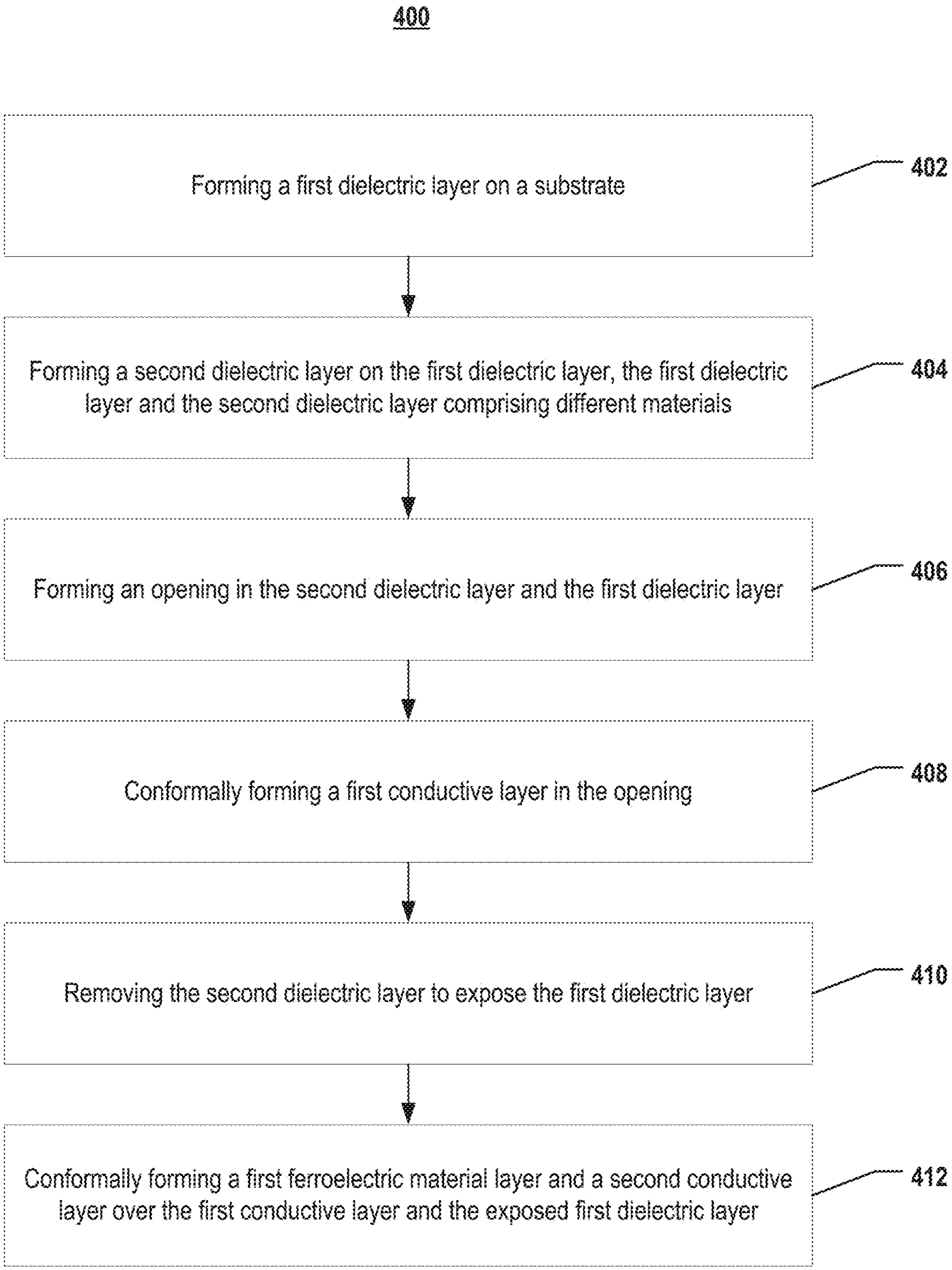
FIG. 28 illustrates a flowchart of another exemplary method for forming a memory device, according to some aspects of the present disclosure.

FIGS. 16-26 illustrate cross-sections of an exemplary ferroelectric memory cell 200 of a memory device at different stages of a manufacturing process, according to some aspects of the present disclosure. FIG. 28 illustrates a flowchart of an exemplary method 400 for forming a memory device, according to some aspects of the present disclosure. For the purpose of better explaining the present disclosure, the cross-sections of ferroelectric memory cell 200 in FIGS. 16-26 and the flowchart of method 400 in FIG. 28 will be described together. It is understood that the operations shown in method 400 are not exhaustive and that other operations can be performed as well before, after, or between any of the illustrated operations. Further, some of the operations may be performed simultaneously, or in a different order than shown in FIGS. 16-26 and FIG. 28.

The memory device may include a plurality of ferroelectric memory cells 200, and each ferroelectric memory cell 200 may be the storage element of the memory device, e.g., a ferroelectric memory device, and may include various designs and configurations. FIGS. 16-26 show a “2T-2C” ferroelectric memory cell structure that includes two transistors and two capacitors. However, the amount of the transistors and/or the capacitors in ferroelectric memory cells 200 is not limited hereto, and other suitable designs of ferroelectric memory cell structures, e.g., 1T-1C or nT-nC ferroelectric memory cell, are in the scope of the present disclosure.

Figure 16:
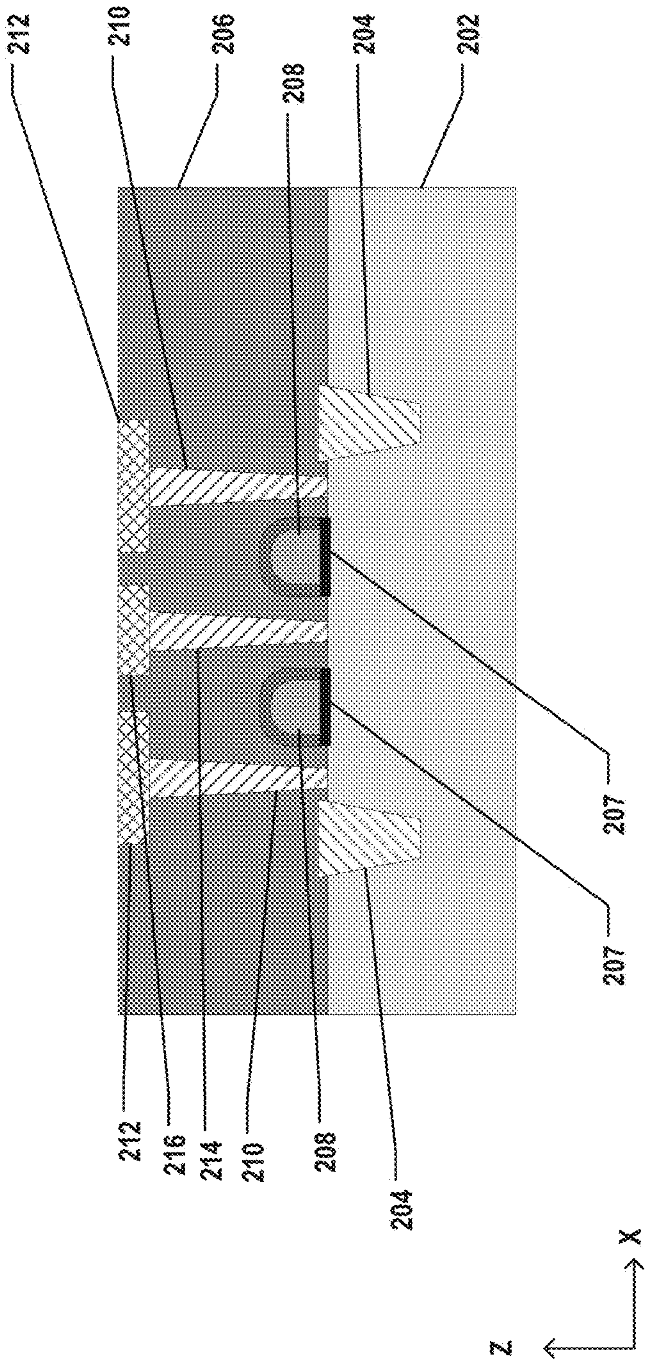
FIGS. 16-26 illustrate cross-sections of another exemplary ferroelectric memory cell of a memory device at different stages of a manufacturing process, according to some aspects of the present disclosure.

As shown in FIG. 16, ferroelectric memory cell 200 includes a substrate 202 and insulating layers 204 formed in substrate 202 to separate and insulate ferroelectric memory cell 200 with adjacent devices or adjacent ferroelectric memory cells. The manufacturing process and the material of substrate 202 and insulating layers 204 may be similar to substrate 102 and insulating layers 104 of ferroelectric memory cell 100. A gate stack having a gate dielectric 207 and a gate conductor 208 is formed on substrate 202, and source/drain regions (not shown) are formed in substrate 202. The manufacturing process and the materials of gate dielectric 207 and gate conductor 208 may be similar to gate dielectric 107 and gate conductor 108 of ferroelectric memory cell 100.

An interconnect 214 and a conductive plate 216 may be in contact with one of the source/drain regions and function as a path to the bit lines of ferroelectric memory cell 200. An interconnect 210 and a conductive plate 212 may be in contact with the other side of the source/drain regions and electrically coupled to an electrode of a capacitor formed in subsequent operations. The manufacturing process and the materials of interconnect 214, conductive plate 216, interconnect 210, and conductive plate 212 may be similar to interconnect 114, conductive plate 116, interconnect 110, and conductive plate 112 of ferroelectric memory cell 100. Substrate 202, insulating layers 204, gate stack, interconnects 210, interconnect 214, conductive plates 212, and conductive plate 216 are covered by an ILD layer 206, such as $SiO_x$ or $SiN_x$. In some embodiments, the top surfaces of ILD layer 206, conductive plates 212, and conductive plate 216 are coplanar.

Figure 17:
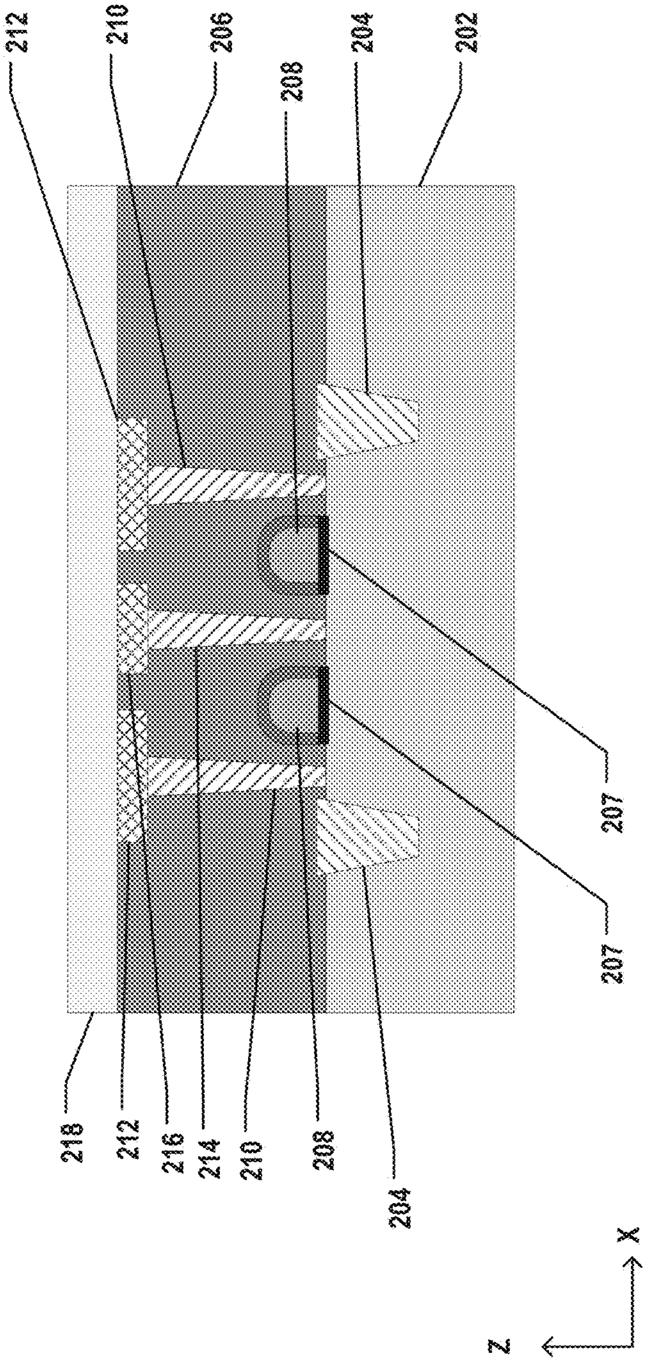

As shown in FIG. 17 and operation 402 of FIG. 28, a first dielectric layer 218 is formed on ILD layer 206, conductive plates 212, and conductive plate 216. First dielectric layer 218 may include $SiO_x$ or $SiN_x$ and may be formed by CVD, PVD ALD, or other suitable processes. In the present disclosure, first dielectric layer 218 has a dense structure sufficient to support the capacitor electrodes formed in subsequent operations.

Figure 18:
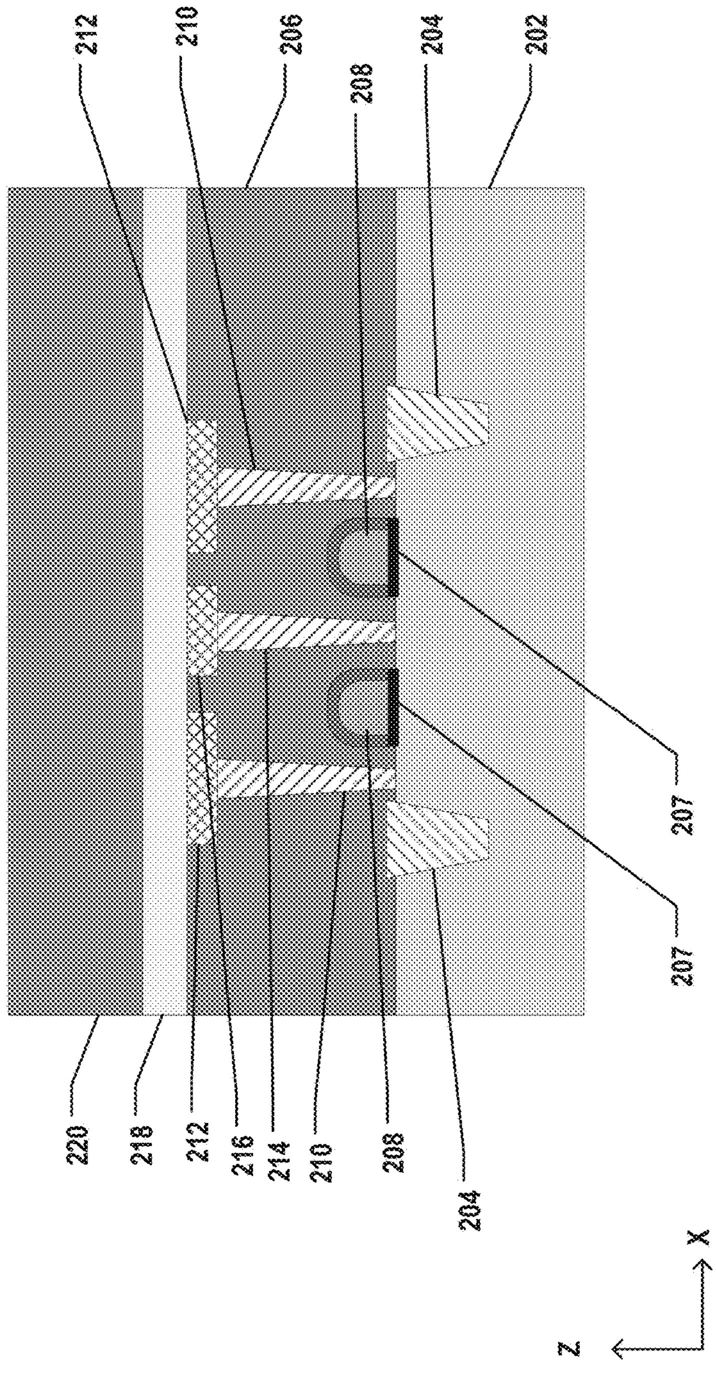
Figure 19:
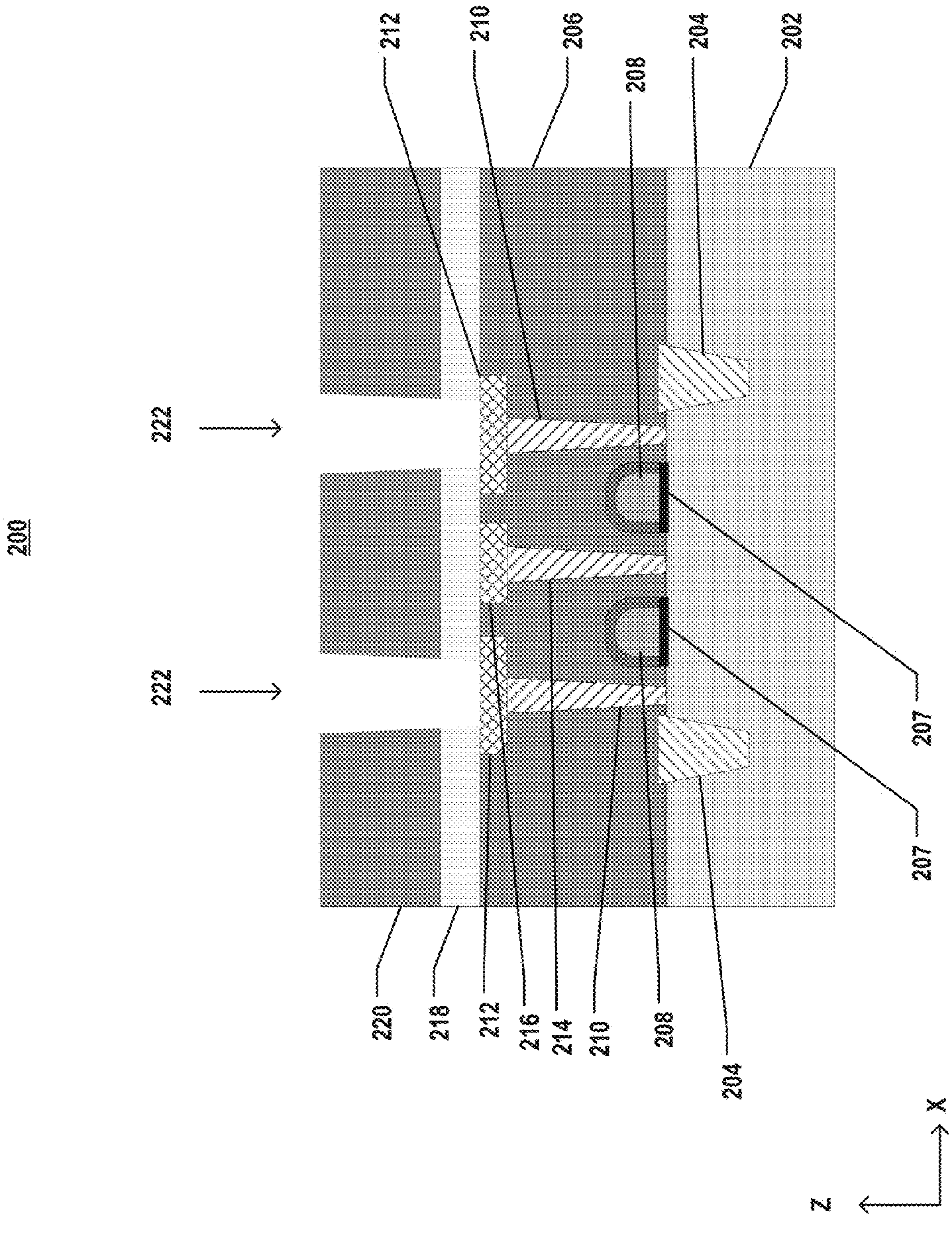

As shown in FIG. 18 and operation 404 of FIG. 28, a second dielectric layer 220 is formed on first dielectric layer 218. Second dielectric layer 220 may include $SiO_x$, $SiN_x$, or other suitable materials. In some embodiments, first dielectric layer 218 and second dielectric layer 220 may include different materials. Then, openings 222 may be formed in first dielectric layer 218 and second dielectric layer 220 to expose the top surface of conductive plates 212, as shown in FIG. 19 and operation 406 of FIG. 28. Openings 222 may be formed by dry etch, wet etch, or other suitable processes.

Figure 20:
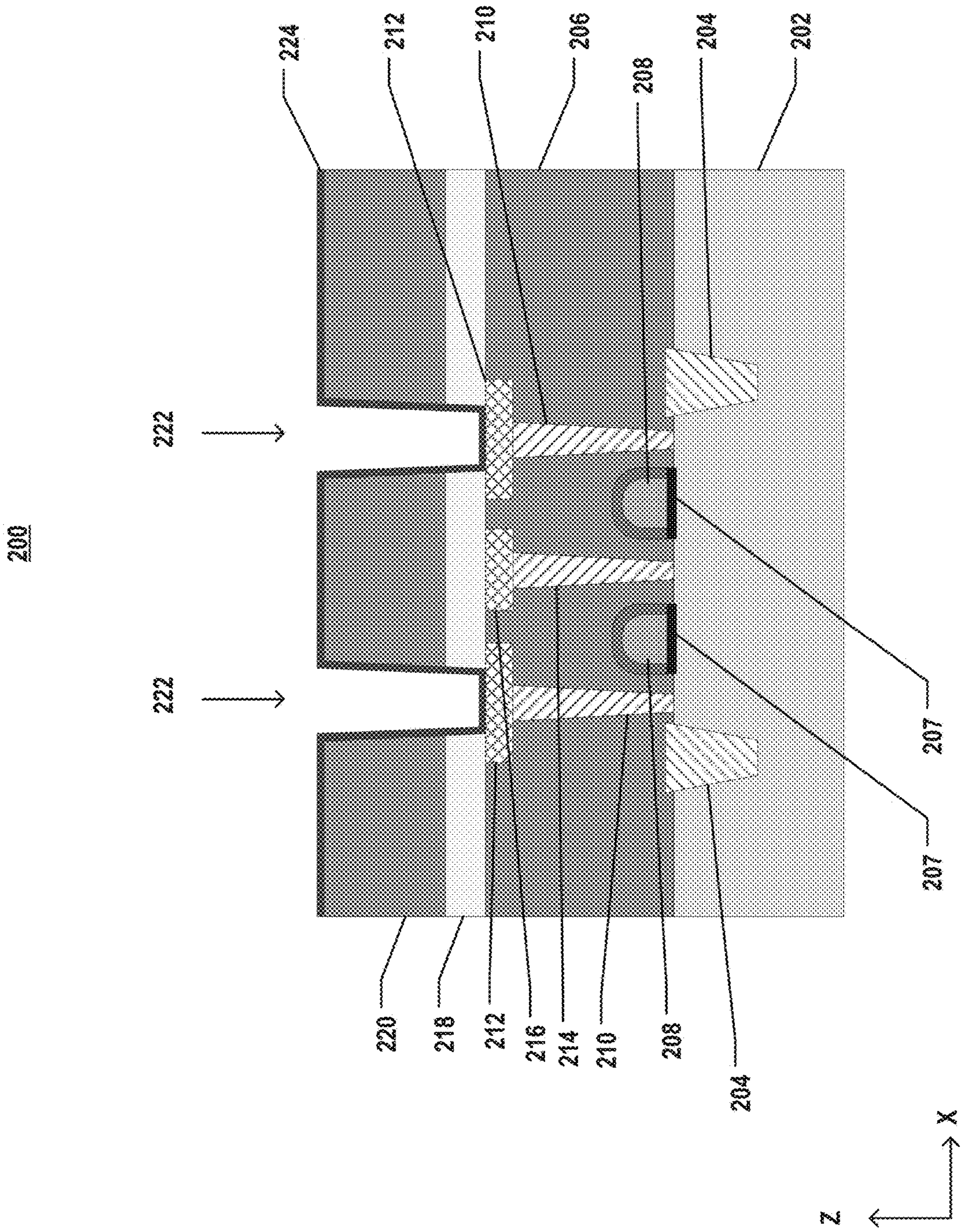
Figure 21:
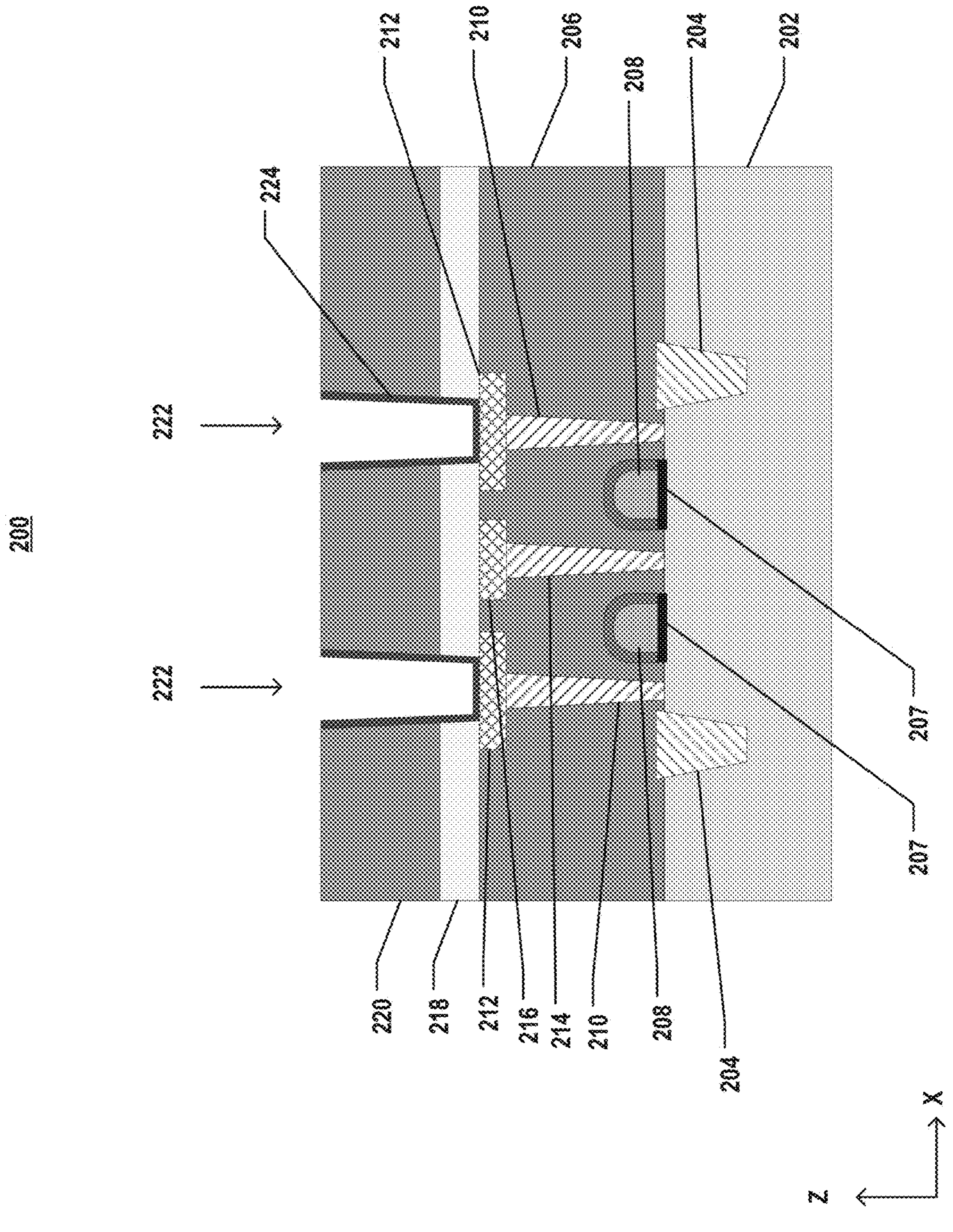

As shown in FIG. 20 and operation 408 of FIG. 28, a first conductive layer 224 is conformally formed in openings 222 and on second dielectric layer 220, and first conductive layer 224 electrically connects the top surface of conductive plates 212. In some embodiments, first conductive layer 224 may include TiN, $TiSiN_x$, $TiAlN_x$, $TiCN_x$, $TaN_x$, $TaSiN_x$, $TaAlN_x$, $WN_x$, $WSi_x$, $WCN_x$, Ru, $RuO_x$, Ir, doped polysilicon, TCO, $IrO_x$, or other suitable materials. Then, as shown in FIG. 21, a planarization operation, e.g., a CMP process, may be performed to remove a portion of first conductive layer 224 above second dielectric layer 220.

Figure 22:
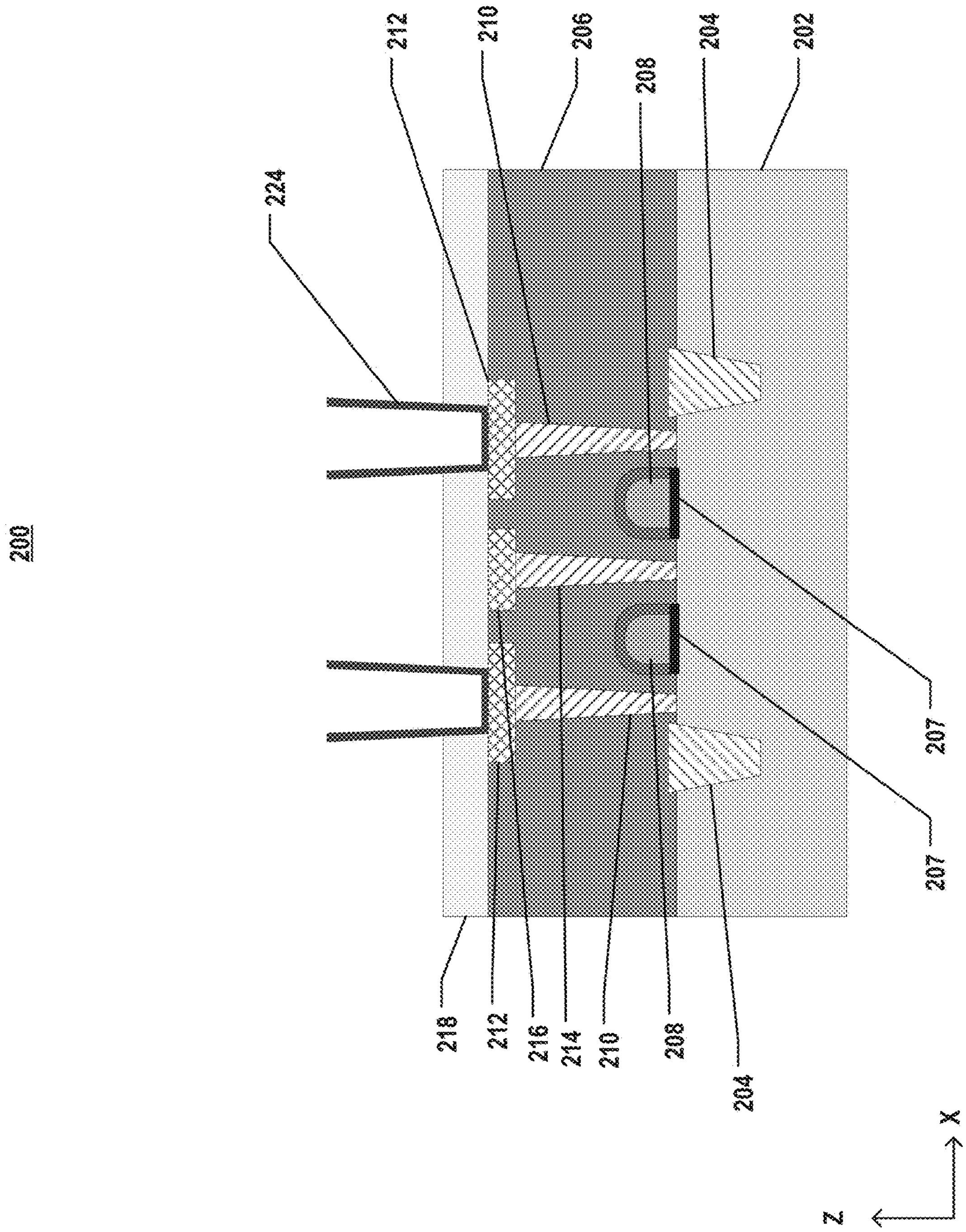

As shown in FIG. 22 and operation 410 of FIG. 28, second dielectric layer 220 is removed, and first dielectric layer 218 is exposed. After removing second dielectric layer 220, first conductive layer 224 is supported by first dielectric layer 218. Second dielectric layer 220 may be removed by dry etch, wet etch, or other suitable processes.

Figure 23:
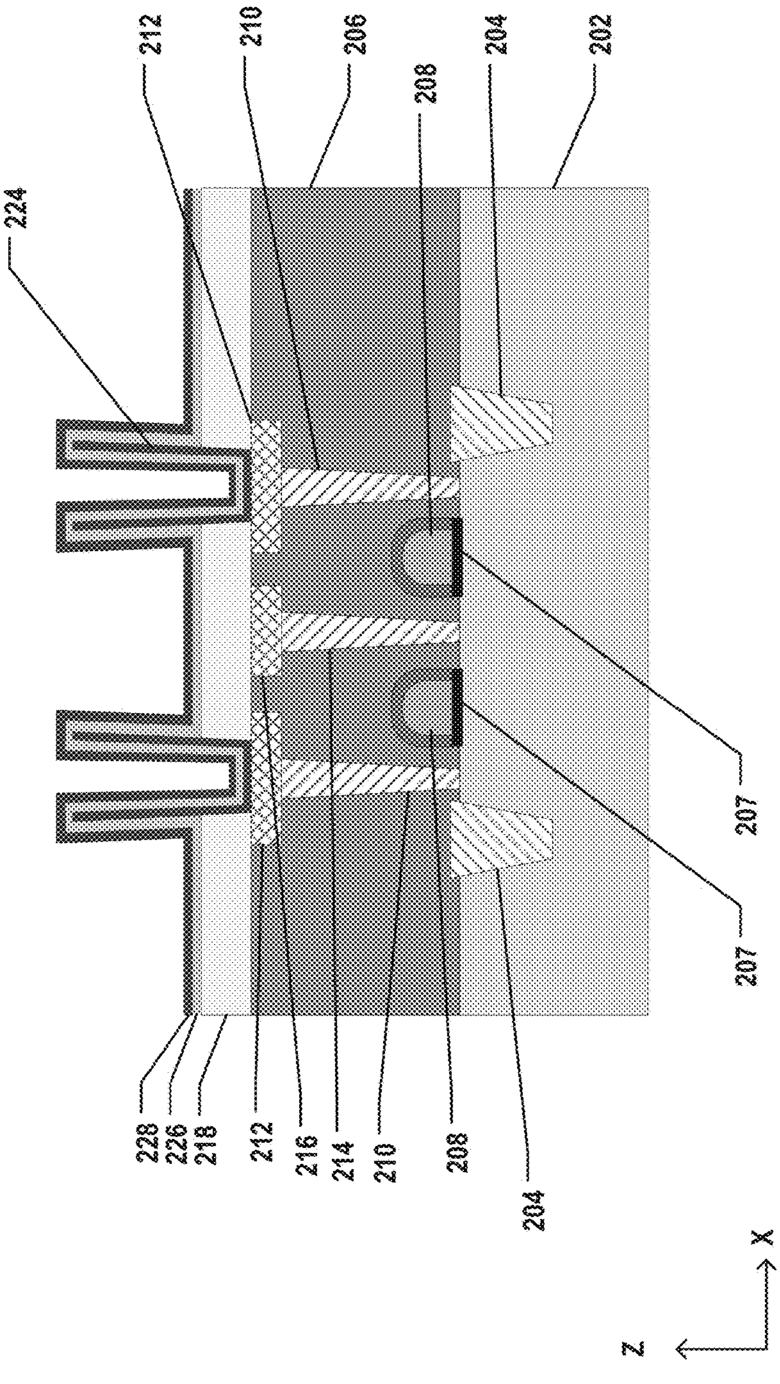

As shown in FIG. 23 and operation 412 of FIG. 28, a first ferroelectric material layer 226 and a second conductive layer 228 are conformally formed over first conductive layer 224 and the exposed first dielectric layer 218. Second conductive layer 228 may be formed by materials similar to first conductive layer 224.

In some embodiments, first ferroelectric material layer 226 may include a ferroelectric oxide material. The ferroelectric oxide may be doped with a plurality of dopants, which can improve ferroelectric film crystallization. For example, the dopants may provide elasticity during the crystallization of the doped ferroelectric layer, reducing the number of defects formed in the ferroelectric film crystallization, and improving high-K ferroelectric phase formation. It is understood that in some embodiments, first ferroelectric material layer 226 may include a multi-layer structure.

In some embodiments, first ferroelectric material layer 226 may include a ferroelectric composite oxide. In some embodiments, first ferroelectric material layer 226 may include oxygen and one or more ferroelectric metals. The ferroelectric metals can include, but not limited to, Zr, Hf, Ti, Al, or other suitable materials. In some embodiments, first ferroelectric material layer 226 may include oxygen and two or more ferroelectric metals. In some embodiments, first ferroelectric material layer 226 may include oxygen and anon-metal material such as Si. In some embodiments, first ferroelectric material layer 226 may also include a plurality of dopants formed as a part of the crystal structures. In some embodiments, the dopants compensate for the defects formed during the crystallization of the ferroelectric oxide material to improve the film quality of first ferroelectric material layer 226. In some embodiments, the dopants are different from the ferroelectric metals in the ferroelectric oxide material and include one or more dopants from one or more of Hf, Zr, Ti, Al, Si, H, O, V, Nb, Ta, Y, and/or La.

Figure 24:
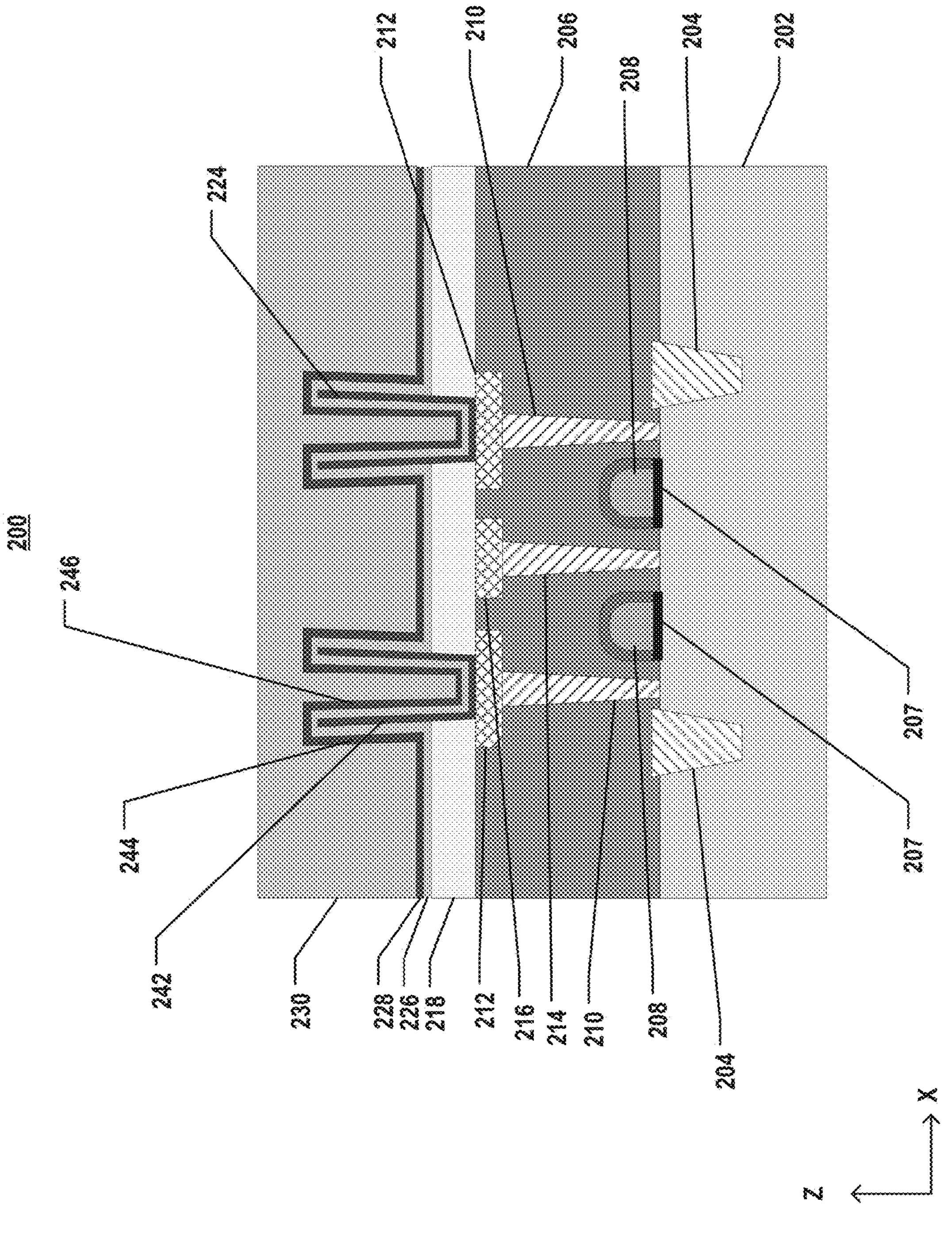
Figure 25:
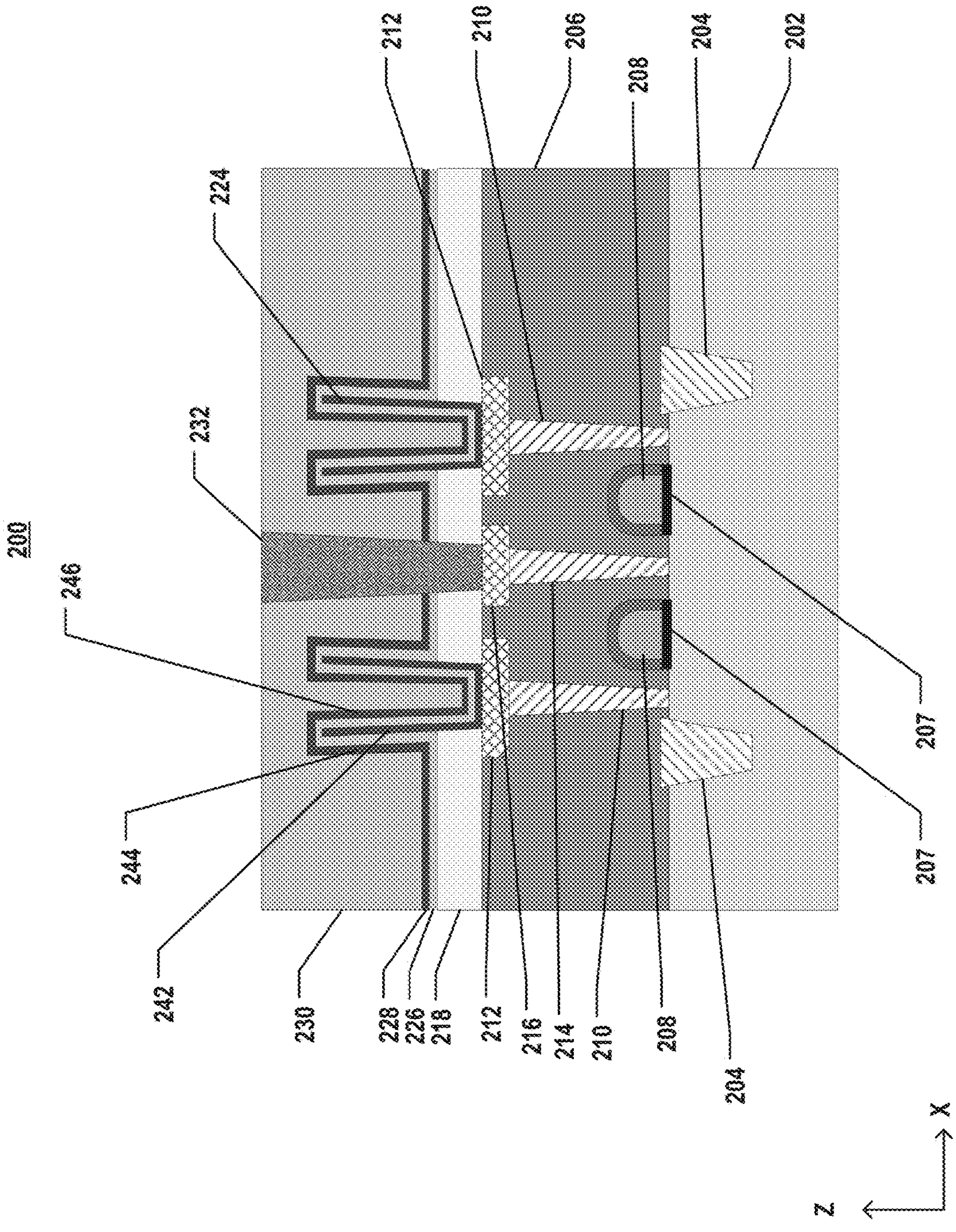

As shown in FIG. 24, a semiconductor layer 230 is formed covering second conductive layer 228. In some embodiments, semiconductor layer 230 may be a doped polysilicon layer and may be a plate line electrically coupling an electrode of the capacitor of ferroelectric memory cell 200. Then, as shown in FIG. 25, an insulation layer 232 is formed in semiconductor layer 230, second conductive layer 228, first ferroelectric material layer 226, and first dielectric layer 218 to isolate second conductive layer 228, first ferroelectric material layer 226 into separated capacitor units. In some embodiments, insulation layer 232 may contact conductive plate 216, as shown in FIG. 25. In some embodiments, insulation layer 232 may be above conductive plate 216 and contact first dielectric layer 218. In some embodiments, insulation layer 232 may include $SiO_x$, $SiN_x$, or other suitable materials.

In some embodiments, when the memory device is a COB structure, the plate line, semiconductor layer 230, electrically couples second conductive layer 228. Conductive plate 216 may function as the bit line, and conductive plate 212 may couple a lower electrode of the capacitor. Conductive plate 212 connects a first electrode of the capacitor formed by first conductive layer 224. The plate line connects a second electrode of the capacitor formed by second conductive layer 228. The ferroelectric layer, formed by first ferroelectric material layer 226, is disposed between the first electrode and the second electrode.

The capacitor includes the first electrode having a first portion 242, and the second electrode having a second portion 244 and a third portion 246. As shown in FIGS. 24 and 25, second portion 244 and third portion 246 surround first portion 242, and first portion 242 of the first electrode is substantially parallel to second portion 244 and third portion 246 of the second electrode. In other words, first portion 242 of the first electrode is sandwiched between second portion 244 and third portion 246 of the second electrode.

Furthermore, first portion 242 of the first electrode and second portion 244 and third portion 246 of the second electrode extend substantially vertically above conductive plate 212 or above the transistor. Each capacitor of ferroelectric memory cell 200 in FIG. 25 includes a left branch and a right branch, and each branch includes a sandwiched structure form by the first electrode and the second electrode. In some embodiments, the second electrodes of the left branch and the right branch are electrically coupled. In some embodiments, the first electrodes of the left branch and the right branch are electrically coupled. In some embodiments, the first electrodes of the left branch and the right branch are electrically coupled, and the second electrodes of the left branch and the right branch are electrically coupled as well. Furthermore, the left branch and the right branch are electrically coupled through a portion of first conductive layer 224. In some embodiments, the left branch and the right branch are electrically coupled through a portion of second conductive layer 228. Since the second electrode surrounds the first electrode and the area of the second electrode is increased, the capacitance of the capacitor could be increased accordingly.

Since the second electrode surrounds the first electrode and the area of the second electrode is increased, the capacitance of the capacitor could be increased accordingly.

Figure 26:
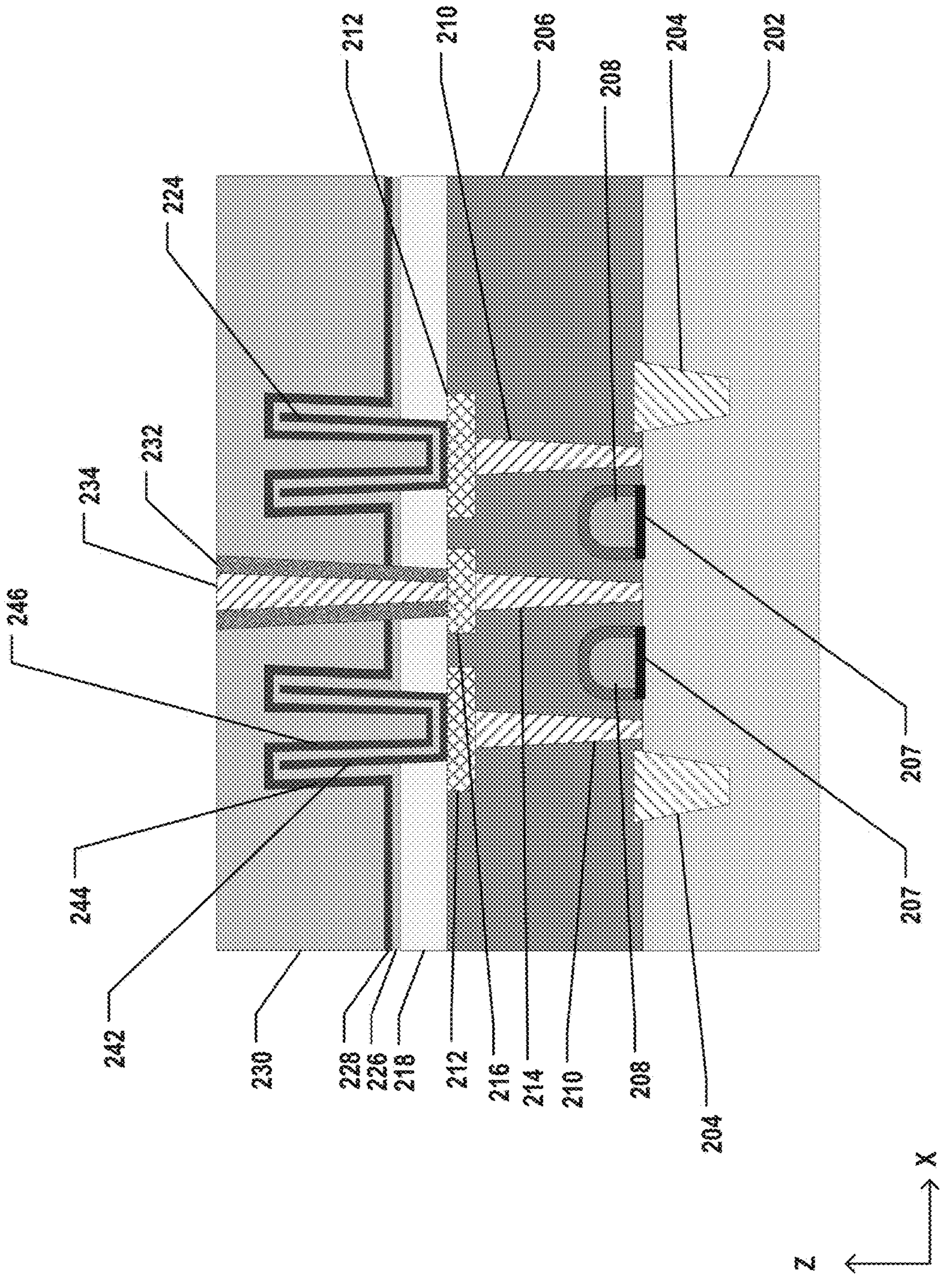

In some embodiments, when the memory device is a CUB structure, after forming insulation layer 232, a bit line interconnect 234 is formed in insulation layer 232 electrically coupling conductive plate 216, as shown in FIG. 26. Then, the bit line of the memory device may be formed on bit line interconnect 234.

The foregoing description of embodiments will reveal the general nature of the present disclosure that others can, by applying knowledge within the skill of the art, readily modify and/or adapt for various applications such embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a plurality of memory cells, each memory cell comprising:
at least one transistor; and
at least one capacitor electrically coupled to the at least one transistor, comprising:
a first electrode;
a second electrode surrounding at least a first portion of the first electrode; and
a ferroelectric layer disposed between the first electrode and the second electrode,
wherein the second electrode comprises a second portion and a third portion substantially parallel to one another, the second portion extends to a higher vertical position than the third portion, and a top surface of the second portion of the second electrode is coplanar with a top surface of the first electrode.

2. The memory device of claim 1, wherein the first portion of the first electrode is substantially parallel to the second portion and the third portion of the second electrode.

3. The memory device of claim 2, wherein the first portion of the first electrode is sandwiched between the second portion of the second electrode and the third portion of the second electrode.

4. The memory device of claim 2, wherein the first portion of the first electrode, the second portion of the second electrode, and the third portion of the second electrode extend substantially vertically above the transistor.

5. The memory device of claim 1, wherein the first electrode comprises a first surface and a second surface opposite to the first surface, wherein the first surface of the first portion of the first electrode is substantially parallel to the second electrode, and the second surface of the first portion of the first electrode is substantially parallel to the second electrode.

6. The memory device of claim 1, wherein the first electrode comprises a first branch and a second branch, and the second electrode comprises a third branch surrounding the first branch of the first electrode and a fourth branch surround the second branch of the first electrode.

7. The memory device of claim 6, wherein the ferroelectric layer is disposed between the first branch of the first electrode and the third branch of the second electrode, and between the second branch of the first electrode and the fourth branch of the second electrode.

8. The memory device of claim 6, wherein the first branch of the first electrode is substantially parallel to the third branch of the second electrode, and the second branch of the first electrode is substantially parallel to the fourth branch of the second electrode.

9. A memory device, comprising:
a plurality of memory cells, each memory cell comprising:
at least one transistor; and
at least one capacitor electrically coupled to the at least one transistor, comprising:
a first electrode;
a second electrode surrounding at least a first portion of the first electrode; and
a ferroelectric layer disposed between the first electrode and the second electrode,
wherein the first electrode comprises a first branch and a second branch, and the second electrode comprises a third branch surrounding the first branch of the first electrode and a fourth branch surround the second branch of the first electrode.

10. The memory device of claim 9, wherein the second electrode comprises a second portion and a third portion, and the first portion of the first electrode is substantially parallel to the second portion and the third portion of the second electrode.

11. The memory device of claim 10, wherein the first portion of the first electrode is sandwiched between the second portion of the second electrode and the third portion of the second electrode.

12. The memory device of claim 10, wherein the first portion of the first electrode, the second portion of the second electrode, and the third portion of the second electrode extend substantially vertically above the transistor.

13. The memory device of claim 9, wherein the first electrode comprises a first surface and a second surface opposite to the first surface, wherein the first surface of the first portion of the first electrode is substantially parallel to the second electrode, and the second surface of the first portion of the first electrode is substantially parallel to the second electrode.

14. The memory device of claim 9, wherein the ferroelectric layer is disposed between the first branch of the first electrode and the third branch of the second electrode, and between the second branch of the first electrode and the fourth branch of the second electrode.

15. The memory device of claim 9, wherein the first branch of the first electrode is substantially parallel to the third branch of the second electrode, and the second branch of the first electrode is substantially parallel to the fourth branch of the second electrode.

16. A memory device, comprising:
a plurality of memory cells, each memory cell comprising:
at least one transistor; and
at least one capacitor electrically coupled to the at least one transistor, comprising:
a first electrode;
a second electrode surrounding at least a first portion of the first electrode; and
a ferroelectric layer disposed between the first electrode and the second electrode,
wherein the second electrode comprises a second portion that extends to a same vertical position as a top surface of the first electrode.

17. The memory device of claim 16, wherein the second electrode further comprises a third portion, and the first portion of the first electrode is substantially parallel to the second portion and the third portion of the second electrode.

18. The memory device of claim 17, wherein the first portion of the first electrode is sandwiched between the second portion of the second electrode and the third portion of the second electrode.

* * * * *